United States Patent
Salowe et al.

(10) Patent No.: US 10,049,175 B1
(45) Date of Patent: Aug. 14, 2018

(54) METHODS, SYSTEMS, AND ARTICLES OF MANUFACTURE FOR INTERACTIVELY IMPLEMENTING PHYSICAL ELECTRONIC DESIGNS WITH TRACK PATTERNS

(71) Applicant: Cadence Design Systems, Inc., San Jose, CA (US)

(72) Inventors: Jeffrey S. Salowe, Los Gatos, CA (US); Min Cao, San Ramon, CA (US); Roland Ruehl, San Carlos, CA (US); Jeffrey Markham, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 74 days.

(21) Appl. No.: 14/800,596

(22) Filed: Jul. 15, 2015

Related U.S. Application Data

(62) Division of application No. 13/931,568, filed on Jun. 28, 2013, now Pat. No. 9,117,052.

(51) Int. Cl.
*G06F 17/50* (2006.01)

(52) U.S. Cl.
CPC ...... *G06F 17/5072* (2013.01); *G06F 17/5081* (2013.01)

(58) Field of Classification Search
CPC .................. G06F 17/5068; G06F 17/5072
USPC .......... 716/110, 118–119, 122, 135, 139
See application file for complete search history.

(56) References Cited

U.S. PATENT DOCUMENTS

| | | | |
|---|---|---|---|
| 2,915,831 A | 12/1959 | Parker | |
| 4,484,292 A | 11/1984 | Hong et al. | |
| 4,811,237 A | 3/1989 | Putatunda et al. | |
| 5,535,134 A | 7/1996 | Cohn et al. | |
| 5,644,500 A | 7/1997 | Miura et al. | |
| 5,729,469 A | 3/1998 | Kawakami | |
| 5,770,481 A | 6/1998 | Fujii | |
| 5,781,446 A | 7/1998 | Wu | |
| 5,801,959 A | 9/1998 | Ding et al. | |
| 6,011,912 A | 1/2000 | Yui et al. | |
| 6,298,468 B1 | 10/2001 | Zhen | |
| 6,324,675 B1 | 11/2001 | Dutta et al. | |
| 6,349,403 B1 | 2/2002 | Dutta et al. | |
| 6,370,673 B1 | 4/2002 | Hill | |
| 6,407,434 B1 | 6/2002 | Rostoker et al. | |
| 6,490,713 B2 | 12/2002 | Matsumoto | |
| 6,505,333 B1 | 1/2003 | Tanaka | |
| 6,543,041 B1 | 4/2003 | Scheffer et al. | |

(Continued)

OTHER PUBLICATIONS

U.S. Appl. No. 13/931,689.

(Continued)

*Primary Examiner* — Stacy Whitmore

(74) *Attorney, Agent, or Firm* — Vista IP Law Group, LLP

(57) ABSTRACT

Some aspects enable users to interactively define a region in an electronic design, identify or generate a track pattern, and assign the track pattern to the region for subsequent physical implementation for the region. Another aspect interactively represents various results on a display apparatus using one or more distinguishing representation schemes. Another aspect is directed at interactive editing a component of an electronic design having track patterns by iteratively modifying a set of track patterns to reach a reduced set of track patterns and by automatically snapping the component to active track(s) in the reduced set for the physical implementation.

20 Claims, 20 Drawing Sheets

(56) References Cited

U.S. PATENT DOCUMENTS

| | | | |
|---|---|---|---|
| 6,557,145 B2 | 4/2003 | Boyle et al. | |
| 6,557,153 B1 | 4/2003 | Dahl et al. | |
| 6,609,237 B1 | 8/2003 | Hamawaki et al. | |
| 6,763,512 B2 | 7/2004 | Xing | |
| 6,769,105 B1 | 7/2004 | Teig et al. | |
| 6,813,755 B2 | 11/2004 | Xing | |
| 6,851,100 B1 | 2/2005 | You et al. | |
| 6,892,371 B1 | 5/2005 | Teig et al. | |
| 6,931,616 B2 | 8/2005 | Teig et al. | |
| 6,938,226 B2 | 8/2005 | Nguyen et al. | |
| 6,938,234 B1 | 8/2005 | Teig et al. | |
| 6,957,407 B2 | 10/2005 | Suto | |
| 6,957,411 B1 | 10/2005 | Teig et al. | |
| 6,981,235 B1 | 12/2005 | Salowe et al. | |
| 6,996,512 B2 | 2/2006 | Alpert et al. | |
| 7,016,794 B2 | 3/2006 | Schultz | |
| 7,039,881 B2 | 5/2006 | Regan | |
| 7,051,313 B1 | 5/2006 | Betz et al. | |
| 7,076,750 B1 | 7/2006 | Lukanc | |
| 7,089,526 B1 | 8/2006 | Salowe et al. | |
| 7,096,445 B1 | 8/2006 | Pucci et al. | |
| 7,100,128 B1 | 8/2006 | Nequist et al. | |
| 7,107,564 B1 | 9/2006 | Teig et al. | |
| 7,117,468 B1 | 10/2006 | Teig et al. | |
| 7,139,993 B2 | 11/2006 | Proebsting et al. | |
| 7,222,322 B1 | 5/2007 | Chyan et al. | |
| 7,257,797 B1 | 8/2007 | Waller et al. | |
| 7,363,607 B2 | 4/2008 | Birch et al. | |
| 7,516,433 B1 | 4/2009 | Pucci et al. | |
| 7,523,430 B1 | 4/2009 | Patel | |
| 7,594,214 B1 | 9/2009 | Salowe et al. | |
| 7,640,520 B2 | 12/2009 | Wang et al. | |
| 7,657,852 B2 | 2/2010 | Waller | |
| 7,694,261 B1 | 4/2010 | Chyan et al. | |
| 7,735,043 B2 | 6/2010 | Ueda | |
| 7,752,590 B1 | 7/2010 | Chyan et al. | |
| 7,802,208 B1 | 9/2010 | Waller et al. | |
| 7,890,909 B2 | 2/2011 | Pyapali et al. | |
| 7,934,177 B2 | 4/2011 | Shin | |
| 7,958,480 B1 | 6/2011 | Slonim et al. | |
| 8,006,216 B1 | 8/2011 | Chen et al. | |
| 8,028,253 B2 | 9/2011 | Drapeau | |
| 8,032,856 B2 | 10/2011 | Itagaki | |
| 8,045,546 B1 | 10/2011 | Bao et al. | |
| 8,050,256 B1 | 11/2011 | Bao et al. | |
| 8,108,823 B2 | 1/2012 | Allen et al. | |
| 8,239,806 B2 | 8/2012 | Chen et al. | |
| 8,250,507 B1 | 8/2012 | Agarwal et al. | |
| 8,286,111 B2 | 10/2012 | Chandra et al. | |
| 8,375,348 B1 | 2/2013 | Raj et al. | |
| 8,418,110 B2 | 4/2013 | Keinert et al. | |
| 8,473,885 B2 | 6/2013 | Cohn et al. | |
| 8,490,036 B2 | 7/2013 | Waller | |
| 8,495,547 B2 | 7/2013 | Keinert et al. | |
| 8,495,549 B2 | 7/2013 | Maruyama et al. | |
| 8,510,703 B1 | 8/2013 | Wadland et al. | |
| 8,560,998 B1 | 10/2013 | Salowe et al. | |
| 8,612,914 B2 | 12/2013 | Sherlekar et al. | |
| 8,640,080 B1 | 1/2014 | Salowe et al. | |
| 8,645,893 B1 | 2/2014 | Yeung et al. | |
| 8,671,368 B1 | 3/2014 | Salowe et al. | |
| 8,683,418 B2 | 3/2014 | Bose et al. | |
| 8,689,121 B2 | 4/2014 | O'Riordan | |
| 8,737,392 B1 | 5/2014 | Bao et al. | |
| 8,769,455 B1 | 7/2014 | Singh et al. | |
| 8,782,586 B2 | 7/2014 | Sezginer et al. | |
| 8,914,763 B1 | 12/2014 | Raj et al. | |
| 2001/0004762 A1* | 6/2001 | Matsumoto | G06F 17/5068 716/120 |
| 2001/0038612 A1 | 11/2001 | Vaughn | |
| 2003/0014201 A1 | 1/2003 | Schultz | |
| 2003/0084418 A1 | 5/2003 | Regan | |
| 2003/0126578 A1 | 7/2003 | Wadland et al. | |
| 2004/0143797 A1* | 7/2004 | Nguyen | G06F 17/5068 716/122 |
| 2006/0288323 A1 | 12/2006 | Birch | |
| 2007/0044060 A1 | 2/2007 | Waller | |
| 2007/0101303 A1 | 5/2007 | Lien | |
| 2007/0106969 A1 | 5/2007 | Birch et al. | |
| 2007/0162884 A1 | 7/2007 | Matsuno et al. | |
| 2007/0245286 A1 | 10/2007 | Ueda | |
| 2008/0072182 A1 | 3/2008 | He et al. | |
| 2008/0244504 A1 | 10/2008 | Drapeau | |
| 2008/0250375 A1* | 10/2008 | Miller | G06F 17/5072 716/122 |
| 2009/0055792 A1 | 2/2009 | Itagaki | |
| 2009/0144688 A1 | 6/2009 | Uchino et al. | |
| 2009/0172628 A1 | 7/2009 | Chyan | |
| 2009/0319974 A1* | 12/2009 | Allen | G06F 17/5045 716/122 |
| 2010/0011327 A1 | 1/2010 | Becker et al. | |
| 2010/0037200 A1 | 2/2010 | Ghan | |
| 2010/0100862 A1 | 4/2010 | Ohtsuka | |
| 2010/0106274 A1 | 4/2010 | Konno et al. | |
| 2010/0115479 A1 | 5/2010 | Hatano et al. | |
| 2010/0122227 A1 | 5/2010 | Waller | |
| 2010/0122228 A1 | 5/2010 | McCracken et al. | |
| 2010/0199253 A1 | 8/2010 | Cheng et al. | |
| 2010/0205575 A1 | 8/2010 | Arora et al. | |
| 2010/0229140 A1* | 9/2010 | Strolenberg | G06F 17/5072 716/52 |
| 2010/0257498 A1* | 10/2010 | Alpert | G06F 17/505 716/113 |
| 2010/0306727 A1 | 12/2010 | Itagaki | |
| 2011/0014786 A1 | 1/2011 | Sezginer | |
| 2011/0055784 A1 | 3/2011 | Gao et al. | |
| 2011/0119648 A1 | 5/2011 | Chen et al. | |
| 2011/0185329 A1 | 7/2011 | Wen et al. | |
| 2011/0214100 A1 | 9/2011 | McElvain | |
| 2011/0219341 A1 | 9/2011 | Cao et al. | |
| 2011/0260318 A1 | 10/2011 | Eisenstadt | |
| 2011/0296360 A1 | 12/2011 | Wang et al. | |
| 2012/0079442 A1 | 3/2012 | Akar et al. | |
| 2012/0131528 A1 | 5/2012 | Chen et al. | |
| 2012/0241986 A1 | 9/2012 | Sherlekar et al. | |
| 2012/0286331 A1 | 11/2012 | Aton et al. | |
| 2013/0019220 A1 | 1/2013 | Maruyama et al. | |
| 2013/0036396 A1 | 2/2013 | Arayama et al. | |
| 2013/0086543 A1 | 4/2013 | Agarwal et al. | |
| 2013/0086545 A1 | 4/2013 | Alpert et al. | |
| 2013/0155555 A1 | 6/2013 | Blanc et al. | |
| 2013/0159965 A1 | 6/2013 | Karatal et al. | |
| 2014/0157220 A1 | 6/2014 | Arayama et al. | |
| 2014/0167117 A1 | 6/2014 | Quandt et al. | |
| 2014/0189617 A1* | 7/2014 | Rashingkar | G06F 17/5077 716/102 |
| 2014/0359546 A1* | 12/2014 | Chan | G06F 17/5072 716/119 |

OTHER PUBLICATIONS

U.S. Appl. No. 13/931,627.
U.S. Appl. No. 13/931,503.
U.S. Appl. No. 14/044,836.
U.S. Appl. No. 13/931,707.
Agilent Technologies, "Momentum", 2006, Agilient, pp. 1-40.
Non-Final Office Action dated Aug. 4, 2014 for U.S. Appl. No. 13/931,568.
Jones, David L., "PCB Design Tutorial, Revision A", Jun. 29, 2004, David L. Jones and www.alternatezone.com, pp. 1-25.
Final Office Action dated Dec. 31, 2014 for U.S. Appl. No. 13/931,568.
Notice of Allowance dated Apr. 8, 2015 for U.S. Appl. No. 13/931,568.
Non-Final Office Action dated Dec. 6, 2013 for U.S. Appl. No. 13/931,689.
Notice of Allowance dated Jun. 4, 2014 for U.S. Appl. No. 13/931,689.
Non-Final Office Action dated Jul. 15, 2014 for U.S. Appl. No. 14/044,836.
Final Office Action dated Nov. 13, 2014 for U.S. Appl. No. 14/044,836.

(56) References Cited

OTHER PUBLICATIONS

Non-Final Office Action dated Mar. 10, 2015 for U.S. Appl. No. 14/318,507.
Non-Final Office Action dated Dec. 19, 2014 for U.S. Appl. No. 14/318,507.
Final Office Action dated Nov. 17, 2014 for U.S. Appl. No. 13/931,627.
Notice of Allowance dated Mar. 3, 2015 for U.S. Appl. No. 13/931,627.
Dion et al., Contour: A Tile-based Gridless Router, 30 pages, Western Research Laboratory, Mar. 1995.
Hwang, Chanseok, and Massoud Pedram. "Interconnect design methods for memory design." Proceedings of the 2004 Asia and South Pacific Design Automation Conference. IEEE Press, 2004.
Jeffrey Salowe, "Gridding for Advanced Process Nodes" 2012.
Lin, I-Jye, Tsui-Yee Ling, and Yao-Wen Chang. "Statistical circuit optimization considering device andinterconnect process variations." Proceedings of the 2007 international workshop on System level interconnect prediction. ACM, 2007.
Ou, Hung-Chih, Hsing-Chih Chang Chien, and Yao-Wen Chang. "Simultaneous analog placement and routing with current flow and current density considerations." Proceedings of the 50th Annual Design Automation Conference. ACM, 2013.
Pompl, T., et al. "Practical aspects of reliability analysis for IC designs." Proceedings of the 43rd annual Design Automation Conference. ACM, 2006.
Singh, Jaskirat, and Sachin S. Sapatnekar. "Topology optimization of structured power/ground networks." Proceedings of the 2004 international symposium on Physical design. ACM, 2004.
Wang, Laung-Terng, Charles E. Stroud, and Nur A. Touba. System-on-chip test architectures: nanometer design for testability. Morgan Kaufmann, 2010.
Li et al., "NEMO: A New Implicit-Connection Graph-Based Gridless Router With Multilayer Planes and Pseudo Tile Propagation,""IEEE Trans. on CAD of ICs & Systems, vol. 26, No. 4 Apr. 2007, pp. 705-718."
Lin et al., "Double Patterning Lithography Aware Grid less Detailed Routing with Innovative Conflict Graph,""DAC'1 0, Jun. 13-18, 2010, pp. 398-403."
Cho et al., "Double Patterning Technology Friendly Detailed Routing", IEEE/ACM International Conference, 2008, pp. 506-511.
Non-Final Office Action dated Jun. 13, 2014 for U.S. Appl. No. 13/931,627.
Non-Final Office Action dated Apr. 2, 2014 for U.S. Appl. No. 13/931,503.
Final Office Action dated May 1, 2014 for U.S. Appl. No. 13/931,707.
Non-Final Office Action dated Oct. 28, 2013 for U.S. Appl. No. 13/931,707.
Hsu et al., "Template-Mask Design Methodology for Double Patterning Technology," 2010 IEEE, pp. 107-111.
U.S. Appl. No. 13/602,069, filed Aug. 31, 2012.
U.S. Appl. No. 13/602,071, filed Aug. 31, 2012.
U.S. Appl. No. 13/692,970, filed Dec. 3, 2012.
U.S. Appl. No. 13/705,164, filed Dec. 4, 2012.
Final Office Action dated Jul. 17, 2014 for U.S. Appl. No. 13/931,503.
Notice of Allowance dated Nov. 10, 2014 for U.S. Appl. No. 13/931,503.
Notice of Allowance dated Sep. 25, 2014 for U.S. Appl. No. 13/931,707.
Non-Final Office Action dated Apr. 10, 2015 for U.S. Appl. No. 13/931,689.
Notice of Allowance dated Sep. 25, 2015 for U.S. Appl. No. 13/931,689.
Notice of Allowance dated Jun. 10, 2015 for U.S. Appl. No. 14/318,507.

\* cited by examiner

752 Identify A Region in An Electronic Design Ready for Physical Implementation with Track Pattern Constraint(s) of A Component Having Multiple Hierarchies

↓

754 Identify Hierarchical Layers of the Component That Are Governed by the Track Pattern Constraint(s)

↓

756 Identify Relative Locations among the Hierarchical Layers

↓

758 Determine A Set of Available Track Pattern(s) for Each of the Hierarchical Layers of the Component

↓

760 Determine A Reduced Set of Track Patterns from the Set of Available Track Pattern Pattern(s) for Each of the Hierarchical Layers

↓

762 Identify Guide Point(s) for the Component on A Hierarchical Layer

↓

764 Identify A Set of Requirement(s) Governing Physical Implementation of the Hierarchical Layer of the Component

↓

766 Identify Active Track(s) on the Hierarchical Layer

↓

768 Auto. Snap the Guide Point(s) to the Active Track(s) in the Reduced Set of Track Pattern(s) for the Physical Implementation of the Component

↓

770 Complete the Physical Implementation of the Component Based At Least In Part On the Auto. Snapping of the Guide Point(s) and the Relative Locations

FIG. 7B

METHODS, SYSTEMS, AND ARTICLES OF MANUFACTURE FOR INTERACTIVELY IMPLEMENTING PHYSICAL ELECTRONIC DESIGNS WITH TRACK PATTERNS

CROSS-REFERENCE TO RELATED APPLICATION(S)

This Application is a divisional of U.S. patent application Ser. No. 13/931,568 filed on Jun. 28, 2013 and entitled "METHODS, SYSTEMS, AND ARTICLES OF MANUFACTURE FOR INTERACTIVELY IMPLEMENTING PHYSICAL ELECTRONIC DESIGNS WITH TRACK PATTERNS". This application is also related to U.S. patent application Ser. No. 13/931,689 filed on Jun. 28, 2013 and entitled "METHODS, SYSTEMS, AND ARTICLES OF MANUFACTURE FOR ASSOCIATING TRACK PATTERNS WITH ROUTING FOR ELECTRONIC DESIGNS", U.S. patent application Ser. No. 13/931,627 filed on Jun. 28, 2013 and entitled "METHODS, SYSTEMS, AND ARTICLES OF MANUFACTURE FOR ASSIGNING TRACK PATTERNS TO REGIONS OF AN ELECTRONIC DESIGN", U.S. patent application Ser. No. 13/931,503 filed on Jun. 28, 2013 and entitled "METHODS, SYSTEMS, AND ARTICLES OF MANUFACTURE FOR IMPLEMENTING A PHYSICAL ELECTRONIC DESIGN WITH AREA-BOUNDED TRACKS", and U.S. patent application Ser. No. 13/931,707 filed on Jun. 28, 2013 and entitled "METHODS, SYSTEMS, AND ARTICLES OF MANUFACTURE FOR AUTOMATICALLY ASSIGNING TRACK PATTERNS TO REGIONS FOR PHYSICAL IMPLEMENTATION OF AN ELECTRONIC DESIGN". The content of the aforementioned U.S. patent applications is hereby expressly incorporated by reference in their respective entireties for all purposes.

This Application is further related to U.S. patent application Ser. No. 13/445,832 filed on Apr. 12, 2012 and entitled "METHODS, SYSTEMS, AND ARTICLES OF MANUFACTURE FOR IMPLEMENTING A PHYSICAL DESIGN OF AN ELECTRONIC CIRCUIT WITH AUTOMATIC SNAPPING", U.S. patent application Ser. No. 13/445,847 filed Apr. 12, 2012 and entitled "METHODS, SYSTEMS, AND COMPUTER PROGRAM PRODUCTS FOR IMPLEMENTING INTERACTIVE COLORING OF PHYSICAL DESIGN COMPONENTS IN A PHYSICAL ELECTRONIC DESIGN WITH MULTIPLE-PATTERNING", U.S. patent application Ser. No. 13/445,860 and entitled "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", and U.S. patent application Ser. No. 13/445,874 and entitled "METHODS, SYSTEMS, AND COMPUTER PROGRAM PRODUCT FOR IMPLEMENTING ELECTRONIC DESIGNS WITH CONNECTIVITY AND CONSTRAINT AWARENESS". The content of the aforementioned U.S. patent applications is hereby expressly incorporated by reference in their respective entireties for all purposes.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

Traditionally, layout track pattern includes parallel tracks with uniform pitches. And the tracks cover entire coordinate space. This does not satisfy the needs for 14 nm and below layout design. Under this technology, the track patterns for a certain metal layer needs to be region based and non-uniform. It allow s periodic changes of track pitches and definition of regions w here a certain pattern is active. This poses a challenge for interactive layout editing. User needs to be able to interactively define the track pattern during chip placement stage, and follow such kind of layout pattern during w ire editing. Thus, there exists a need for methods, systems, and articles of manufacture for interactively implementing physical electronic designs with track patterns.

SUMMARY

Disclosed are method(s), system(s), and article(s) of manufacture for interactively implementing physical electronic designs with track patterns in various embodiments.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 7A-B illustrate another more detailed flow diagram for interactively implementing physical electronic designs having track patterns using automatic snapping in some embodiments.

DETAILED DESCRIPTION

Figure 1:
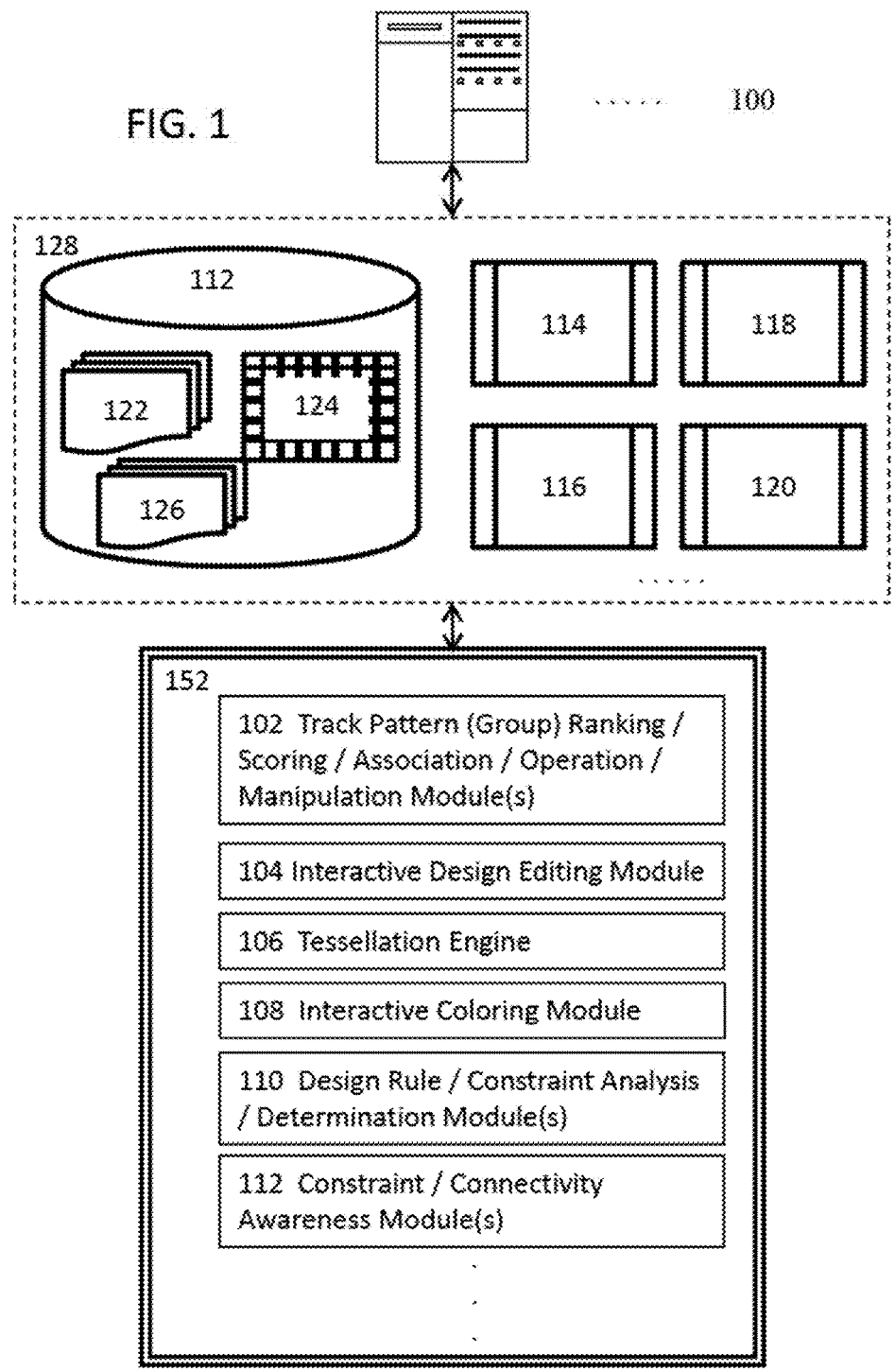
FIG. 1 illustrates a high level block diagram for a system for interactively implementing physical electronic designs with track patterns in some embodiments.

Various embodiments of the invention are directed to a methods, systems, and articles of manufacture for implementing physical electronic designs with track patterns. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are method(s), system(s), and article(s) of manufacture for implementing physical electronic designs with track patterns in one or more embodiments. Some embodiments enable a user to interactively define a region in an electronic design, identify or generate a set of one or more track patterns, one or more track pattern groups, or a combination thereof, identify or determine a set of strip lines, and automatically snap the boundaries that are related to the region in the preferred routing direction or the non-preferred routing direction or both, assign one or more track patterns or track pattern groups to the region for subsequent physical implementation for the region, and interactively represent the results of one or more of the aforementioned processes on a display apparatus using one or more distinguishing representation schemes.

Some embodiments are directed at interactive editing (e.g., adding, removing, modifying, etc.) a component of an electronic design having multiple track patterns including at least one non-uniform track pattern by identifying a region in an electronic design. These embodiments further identify a set of one or more available track patterns including at least one non-uniform track pattern and identify a circuit component that is to be implemented in the physical representation of the electronic design (e.g., a floorplan, a layout, etc.). During or shortly after the physical implementation of the component, these embodiments dynamically or interactively modify or update (collectively "modify") the set of one or more available track patterns based at least in part upon the physical implementation of the component or upon one or more characteristics of the circuit component. These embodiments automatically snap the component to one or more active tracks in the set to complete the physical implementation for the component. Various details of any of the processes, sub-processes, or acts are further provided below with reference to respective drawing figures.

FIG. 1 illustrates a high level block diagram for a system for interactively implementing physical electronic designs with track patterns in some embodiments. In one or more embodiments, the system for interactively implementing physical electronic designs with track patterns may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, a floorplanner, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises a track pattern or track pattern group module 102 to rank or score a plurality of track patterns based on one or more criteria, an interactive design editing module 104 to provide the capabilities of interactive editing (e.g., adding, removing, or modifying) any part of an electronic design, a tessellation module 106 to tessellate an area of an electronic design into strips and to tessellate a strip into multiple regions either alone or jointly with one or more other modules, one or more interactive coloring modules 108 to provide interactive coloring capabilities for providing correct-by-construction electronic designs to be manufactured with multi-exposure techniques, various physical implementation tools such as a global router or a detail router, a layout or physical design editor, one or more modules 110 to perform design rule checks, constraint analysis (e.g., interactive constraint analysis), or to make various determinations, a constraint or connectivity awareness module 112 to provide a constraint and/or connectivity-aware environment to implement electronic designs, etc.

For example, the method or system may interactively check whether an electronic design complies with various constraints or design rules (collectively constraints), such as some net-based spacing constraints that impose some limitations on the spacing between two nets, in a nearly real-time manner while the electronic design is being created in some embodiments. In these embodiments, the disclosed method or system uses the connectivity information provided by a connectivity engine or assigned by a designer to present feedback to a user as to whether a newly created object or a newly modified object complies or violates certain relevant constraints in an interactive manner or in nearly real-time without having to perform such constraints checking in batch mode. More details about the aforementioned modules will become clear and self-explanatory in the remainder of the description with reference to various other drawing figures.

Figure 2:
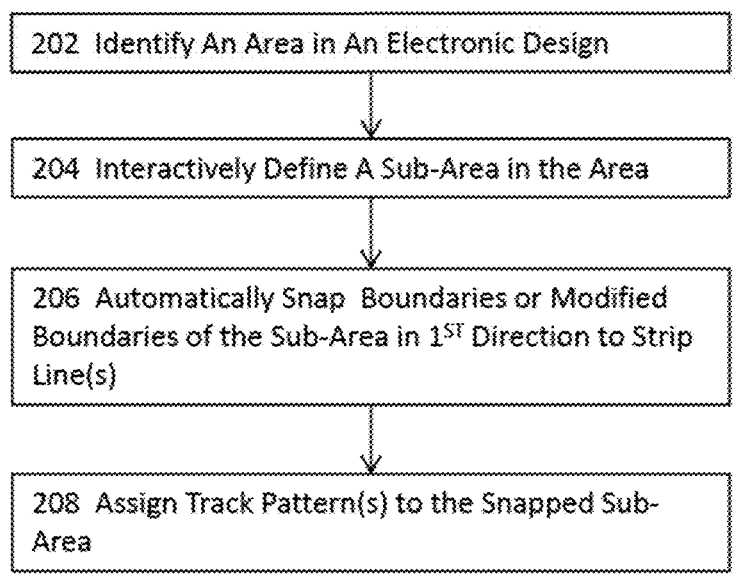
FIG. 2 illustrates a top level flow diagram for interactively implementing physical electronic designs with track patterns in some embodiments.

FIG. 2 illustrates a top level flow diagram for interactively implementing physical electronic designs with track patterns in some embodiments. In one or more embodiments, the method for interactively implementing physical electronic designs with track patterns comprises the process 202 of identifying an area in an electronic design. In some embodiments, the sub-area is identified from a floorplan obtained from the floorplanning process and can thus be used for the placement process. In some embodiments, the sub-area is identified from a placement layout obtained from the placement process and can thus be used for the routing process.

In some embodiments, the method may comprise the process 204 of defining a sub-area in the area. In some embodiments, process 204 includes interactive definition or creation of a sub-area in the area of the electronic design. For example, a user may define the sub-area by, for example, using an input device to delineate or modify the boundary of the sub-area in the area in a graphical user interface by dragging a rectangular sub-area with a computer mouse or in a textual user interface by entering the coordinates or locations of the sub-area. In some embodiments, the sub-area defined at 204 or the area identified at 202 is respectively defined or identified by user interface (UI) driven manipulations.

In some embodiments, the method may comprise the process 206 of automatically snapping the boundaries that are related to the sub-area in the first direction to one or more strip lines. In some embodiments, the boundaries related to the sub-area comprises the bounding box of a component to be physically implemented, where the component may be a single shape, a block of circuit features such as an instance of a cell or an intellectual property (IP) block, or any group of circuit features. In some embodiments, the boundaries related to the sub-area comprises the bounding box of a component plus a uniform or non-uniform halo beyond the external boundary of the component. It shall be noted that a halo may include a uniform extension of the external boundary of the component in some embodiments, and that a halo may include a non-uniform extension of the external boundary of the component in some other components.

For example, a non-uniform halo may be defined and created outside an interconnect that is subjected to parallel run-length rules that require different spacing based on the parallel run-length between two interconnects. The strip lines include a set of parallel straight lines that divide an area of a layer in an electronic circuit design in a direction (e.g., the preferred direction) into a set of strips. The strip lines are generally determined based at least in part upon the power rails, pins, terminals, interfaces, or connections to the external part of the component, upon the user's input or requirements, or a combination thereof. The tessellation is to reference the power rails, pins, terminals, interfaces, or connections to the external part of the component, or the user's input to subdivide the sub-area into multiple strips, each of which has sufficient size to accommodate at least the tracks in a track pattern and thus depends further upon the "-start", "-repeat" and "-spacing" options in the specification of the track pattern. In these embodiments, the boundaries related to the sub-area defined at 204 are expanded to one or more strip lines to form a region. More details about the strip lines and the tessellation are provided in the four U.S. patent applications filed concurrently and indicated in the CROSS REFERENCE TO RELATED APPLICATION section of this application. In some embodiments, process 206 snaps a segment of the boundaries related to the sub-area to the closest strip line that will make the area enclosed by the boundaries larger.

In some embodiments, the method may comprise the process 208 of assigning one or more track patterns to the sub-area, after the boundaries related to the sub-area has been modified to snap to one or more strip lines. In these embodiments, the one or more track patterns are mapped to the "region" derived from 204. In some embodiments, the assignment or mapping of one or more track patterns to a region is performed automatically. In some embodiments, the assignment or mapping of one or more track patterns to a region is performed interactively through user's interactions via the user interface.

Figure 3:
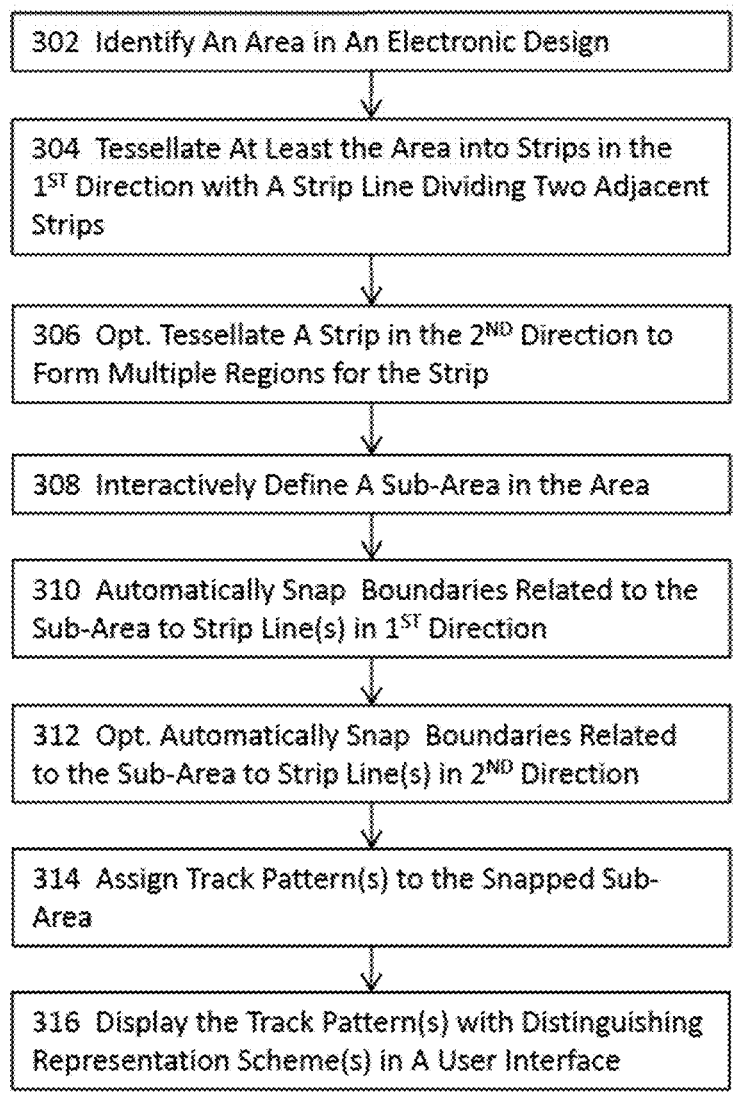
FIG. 3 illustrates a more detailed flow diagram for interactively implementing physical electronic designs with track patterns in some embodiments.

FIG. 3 illustrates a more detailed flow diagram for interactively implementing physical electronic designs with track patterns in some embodiments. In one or more embodiments, the method for interactively implementing physical electronic designs with track patterns may comprise the process 302 of identifying an area in an electronic design in a substantially similar manner as that described for 202. In some embodiments, the method may comprise the process 304 of tessellating at least the area into multiple strips in the first direction with one or more strip lines, each of which divides two adjacent strips. More details about the tessellation process is described with reference to 206 and further in the four U.S. patent applications filed concurrently and indicated in the CROSS REFERENCE TO RELATED APPLICATION section of this application.

In some embodiments, the method may comprise the process 306 of optionally tessellating a strip in a second direction to form multiple regions for the strip. In some embodiments, the first direction may include the preferred routing direction, and the second direction may include the non-preferred routing direction. In some embodiments where only one routing direction is permitted for each layer, the first direction comprises the permitted routing direction, and the second direction comprises the permitted routing direction of the adjacent layers. In some embodiments, the method may comprise the process 308 of defining a sub-area in the area. Process 308 is performed in substantially similar manners as that described for 204 in FIG. 2.

In some embodiments, the method may comprise the process 310 of automatically snapping boundaries related to the sub-area to one or more strip lines in the first direction. Process 310 is performed in substantially similar manners as that described for 206. For example, if the first direction is the horizontal direction, the strip lines comprises a set of parallel, horizontal lines that divide the sub-area into multiple horizontal strips with a strip line between two adjacent strips. In this example, process 310 may automatically snap the upper boundary to the closest strip line that makes the enclosed area within the boundaries larger in some embodiments. In some embodiments, process 310 may similarly snap the lower, horizontal boundary of the boundaries to the closest strip line that makes the enclosed area within the boundaries larger. In some embodiments, process 310 may automatically snap both the upper, horizontal boundary and the lower, horizontal boundary to their respective closest strip lines that make the enclosed area within the boundaries larger.

In some embodiments, the method may comprise the process 312 of optionally automatically snapping the boundaries that are related to the sub-area in a second direction to one or more strip lines. In the above example with a rectangular sub-area, process 312 may automatically snap the right, vertical boundary, the left, vertical boundary, or both vertical boundaries of the boundary to the closest, vertical strip lines that make the enclosed area within the boundaries larger. The strip lines in the second direction may be determined by analyzing the underlying topology, track patterns, physical implementation, routing requirements on one or more layers, constraints, design rules, or other characteristics of one or both neighboring layers that are immediately adjacent to the layer on which the sub-area resides in some embodiments. In these embodiments, the tessellation in the second direction is performed to ensure the placement or the subsequent routing process to successfully implement the physical design in at least the sub-area by permitting, for example, some interconnects to jump between layers while satisfying various design rules or constraints. In various embodiments, the tessellation in the second direction to further divide a strip into multiple regions is performed to create sufficient space to accommodate one or more track patterns in the region. More details about process 312 is provided in the four U.S. patent applications filed concurrently and indicated in the CROSS REFERENCE TO RELATED APPLICATION section of this application.

In some embodiments, the method may comprise the process 314 of assigning one or more track patterns to the snapped sub-area. In some embodiments, process 314 is performed interactively with user's interaction via the user interface. For example, a user may directly assign one or more track patterns to a sub-area. In some embodiments, process 314 is performed automatically. More details about automatic assignment or mapping of one or more track patterns to a region or a sub-area are described in the four U.S. patent applications filed concurrently and indicated in the CROSS REFERENCE TO RELATED APPLICATION section of this application.

In some embodiments, the method may comprise the process 316 of displaying some or all tracks in one or more track patterns with distinguishing representation schemes in a user interface to aid the user to better visualize the tracks of interest. For example, process 316 may use alpha-blending or alpha compositing techniques or processes to accentuate some tracks of interest or some track pattern(s) of interest with more emphasized representation scheme(s) while representing other track(s) or track pattern(s) with less accentuated representation scheme(s).

Figure 4A:
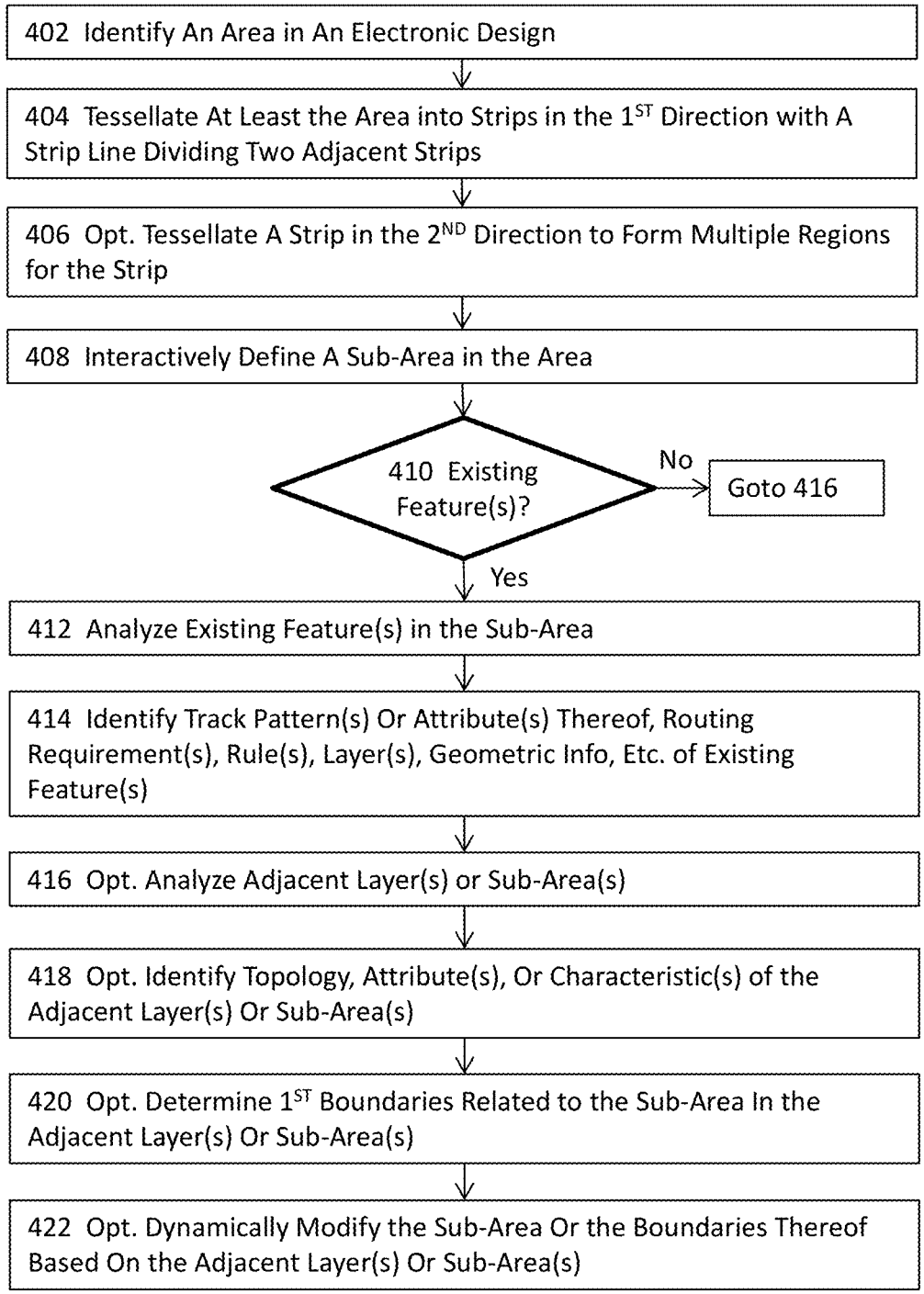
FIGS. 4A-B jointly illustrate a more detailed flow diagram for interactively implementing physical electronic designs with track patterns in some embodiments.
Figure 4B:
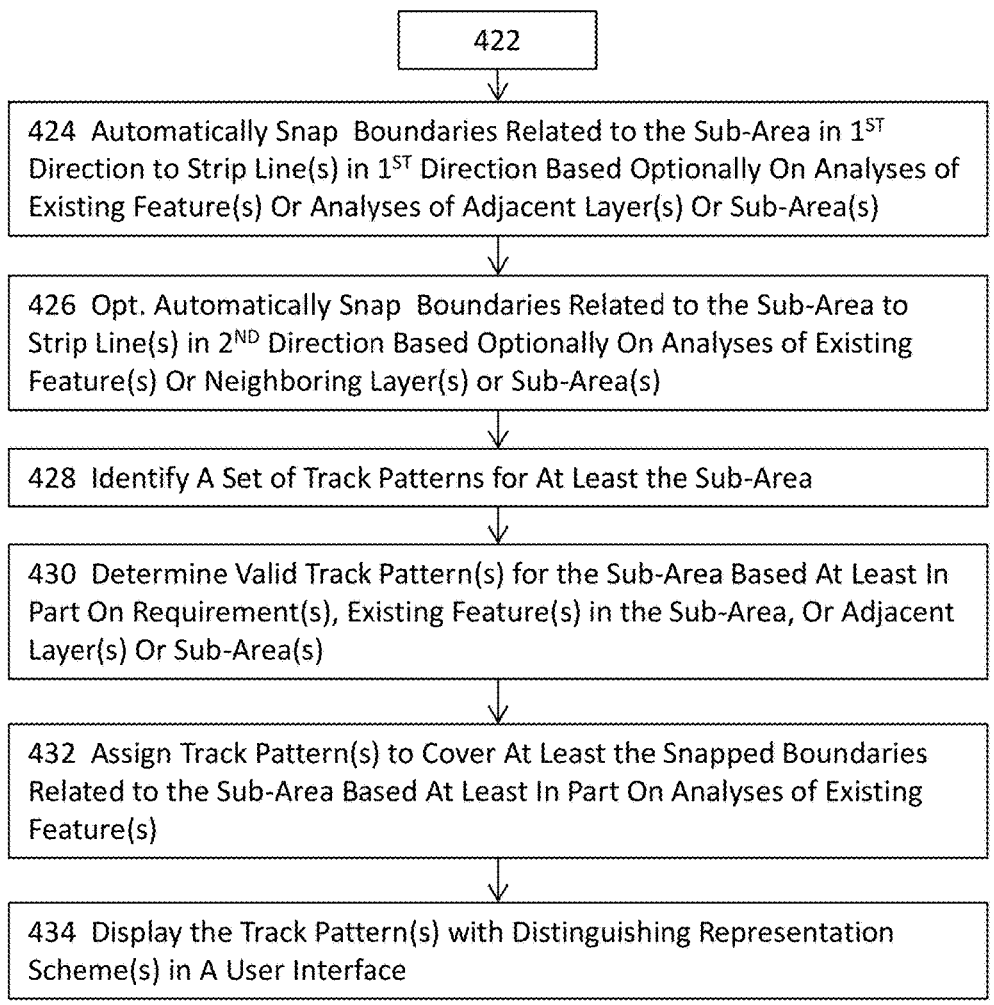

FIGS. 4A-B jointly illustrate a more detailed flow diagram for interactively implementing physical electronic designs with track patterns in some embodiments. In one or more embodiments, the method for interactively implementing physical electronic designs with track patterns may comprise the process 402 of identifying an area in an electronic design. In some embodiments, the electronic design may comprise a floorplan from a floorplanning process and may be used for the placement process. In some embodiments, the electronic design may comprise a layout obtained from the placement process and thus may be used for the routing process. In some embodiments, the electronic design may comprise a routed design subject to modifications.

In some embodiments, the method may comprise the process 404 of tessellating at least the area into multiple strips in the first direction with a strip line dividing two adjacent strips. In some embodiments, the method may comprise the process 406 of optionally tessellating a strip in the second direction to form multiple regions for the strip. In some embodiments, the method may comprise the process 408 of defining a sub-area in the area in substantially similar manners as those described for FIGS. 2-3 above.

In some embodiments, the method may comprise the process 410 of determining whether or not there are some existing features in the sub-area. For example, process 410 may determine whether there are any IP blocks or pins in the sub-area defined at 408. In some embodiments, the method may comprise the process 412 of analyzing the existing features in the sub-area. In some of these embodiments, process 412 analyzes at least some of one or more existing features to identify or determine which attributes or characteristics of the at least some of the one or more existing features affects the track pattern assignment for the sub-area.

In some embodiments, the method may comprise the process 414 of identifying one or more track patterns or one or more attribute(s) thereof, routing requirement(s), rule(s), layer(s), or geometric info, etc. that is related to the existing features. In the above example provided in 412, the process 414 may further identify, for example but not limited to, the extent of such existing features (e.g., the bounding box or a custom-defined halo of an existing feature) and their respective correlations with the sub-area (e.g., the spatial correlation of an existing feature with the sub-area), the connectivity requirements of the at least some of the one or more existing features (e.g., whether an existing feature is electrically connected to the sub-area via an interconnect having a 2x width), the relevant constraints (e.g., spacing constraints, etc.), the track pattern assignments or mappings of the at least some of the one or more existing features, etc.

In some embodiments, the method may comprise the process 416 of optionally analyzing one or more adjacent layers or one or more sub-areas. In some of these embodiments, process 416 optionally analyzes the one or more neighboring layers that are adjacent to the layer on which the sub-area resides or one or more sub-areas (e.g., tessellation regions obtained from dividing a strip) that may affect the track pattern assignment or mapping for the sub-area of interest. In these embodiments, process 416 is to analyze the one or more adjacent layers or one or more sub-areas to obtain information to be processed by process 418 described below.

In some embodiments, the method may comprise the process 418 of optionally identifying the topology, one or more attributes, or one or more characteristics of one or both adjacent layers or one or more sub-areas. Similar to that described for 412 and 414, process 418 may analyze such layers or sub-areas to identify one or more attributes or characteristics including, for example but not limited to, the extent of such existing features (e.g., the bounding box or a custom-defined halo of an existing feature) and their respective correlations with the sub-area (e.g., the spatial correlation of an existing feature with the sub-area), the connectivity requirements of the at least some of the one or more existing features (e.g., whether an existing feature is electrically connected to the sub-area via an interconnect having a 2x width), the relevant constraints (e.g., spacing constraints, etc.), the track pattern assignments or mappings of the at least some of the one or more existing features, etc.

In some embodiments, process 418 may identify the bounding box of a circuit feature on an adjacent layer or in another sub-area. In some embodiments where a cell having multiple hierarchies is manipulated, process 418 may use the same bounding box on each of the multiple hierarchies that are subjected to the track pattern constraint. In some other embodiments, process 418 may use two different bounding boxes on two adjacent layers, and each of the two bounding box may be determined by examining the extent of the cell on each of the two hierarchies. Similarly, process 418 may use the same halo for two adjacent layers of a single cell or two different halos for these two adjacent layers of the single cell. These characteristics or attributes may affect the assignment or mapping of one or more track patterns in the current sub-area. For example, if the corresponding sub-area on an adjacent layer is assigned a 1x-width track pattern, track patterns including 1x-width tracks may also be assigned to the current sub-area such that interconnects of 1x-width may be successfully routed between these two sub-areas on adjacent layers.

In some embodiments, the method may comprise the process 420 of optionally determining the first boundaries that are related to the sub-area in one or both adjacent layer(s) or one or more sub-areas. In some of these embodiments where a hierarchical cell having multiple hierarchies is to be placed in the sub-area, process 420 may determine the first boundaries in an adjacent layer by using the same bounding box as the cell on the current layer or a different bounding box and the same or a different halo.

In some embodiments, the method may comprise the process 422 of optionally, dynamically modifying the sub-area or the boundaries thereof based at least in part on one or both adjacent layers or one or more sub-areas. In some of these embodiments, process 422 extends one or more boundaries to their respective closest strip lines in the first direction (e.g., the preferred direction or the permitted direction) such that the area enclosed by post-snapping boundaries becomes larger than that enclosed by the original boundaries. In some embodiments, process 422 may modify the boundaries of the sub-area such that, in a multi-hierarchy design, interconnects may be successfully routed between adjacent layers. In some embodiments, if routing an interconnect in the a sub-area requires the use of a via to jump to an adjacent layer or vice versa, the boundaries related to the sub-area need to be crafted in such a way that allows the insertion of a via to finish the implementation. For example, the two sub-areas in two adjacent layers need to have sufficient overlap to accommodate, for example, the via cut rules or the via enclosure rule such that a via may be successfully inserted to complete the routing of the interconnect.

In some embodiments, the method may comprise the process 424 of automatically snapping the boundaries that are related to the sub-area in the first direction to one or more strip lines in the first direction based optionally on one or more analyses of the existing features or one or more analyses of one or both adjacent layers or one or more sub-areas. Process 424 may be performed in substantially similar manners as those described for 206 of FIG. 2 and 310 of FIG. 3. In some embodiments, the method may comprise the process 426 of optionally, automatically snapping the boundaries that are related to the sub-area to strip lines in the second direction based optionally on one or more analyses of the existing features or one or more neighboring layers or one or more sub-areas. Process 426 may be performed in substantially similar manners as those described for 312 of FIG. 3.

In some embodiments, the method may comprise the process 428 of identifying a set of track patterns that covers at least the sub-area. In some embodiments, each track pattern in the set of track patterns is identified to cover the area enclosed by the snapped boundaries that are related to the sub-area. In some embodiments, the set of track patterns is provided or required by the user. In some embodiments where the electronic design is first implemented and thus includes no circuit components, all track patterns are made available at 428. The set of track patterns will be reduced by process 430 after taking into account various attributes, characteristics, constraints, requirements, etc. in some embodiments.

In some embodiments, the method may comprise the process 430 of determining one or more valid track patterns for the sub-area based at least in part on one or more requirements, the existing features in the sub-area, or one or more adjacent layers or one or more sub-area(s). In some embodiments, each of the set of track patterns is determined by 430 to satisfy one or more constraints or requirements for track patterns to be assigned to the sub-area. For example, process 430 may identify user specified track patterns or requirements there of (e.g., width requirements for the tracks) or constraints imposed by adjacent layers or neighboring sub-area(s), etc. to determine one or more valid track patterns at 430. More details about the determination of valid or active track patterns are provided in the four U.S. patent applications filed concurrently and indicated in the CROSS REFERENCE TO RELATED APPLICATION section of this application.

In some embodiments, the method may comprise the process 432 of assigning one or more track patterns to cover at least the snapped boundaries related to the sub-area based at least in part on analyses of the existing features. In some of these embodiments, process 432 interactively assigns one or more track patterns to the sub-area through user interactions via a user interface in substantially similar manners as those described for 208 of FIG. 2 or 314 of FIG. 3. In some embodiments, the method may comprise the process 436 of displaying one or more tracks of interest (e.g., the track that is being used for routing) or one or more the track patterns of interest with one or more distinguishing representation schemes in a user interface in substantially similar manners as that described for 316 of FIG. 3.

Figure 5:
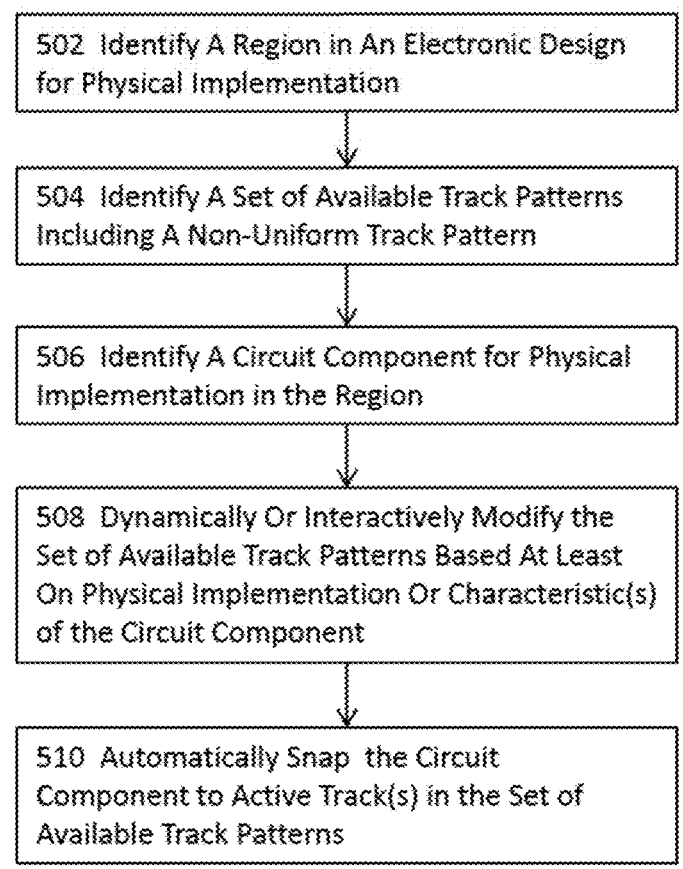
FIG. 5 illustrates another high level flow diagram for interactively implementing physical electronic designs with track patterns in some embodiments.

FIG. 5 illustrates another high level flow diagram for interactively implementing physical electronic designs with track patterns in some embodiments. In one or more embodiments, the method for interactively implementing physical electronic designs with track patterns illustrated in FIG. 5 may include the process 502 of identifying a region in an electronic design for physical implementation. In some embodiments, process 502 identifies the region from a floorplan obtained from a floorplanning tool, a placement layout obtained from a placement tool, or a routed layout obtained from a router. Therefore, these embodiments perform the intended functions and provide the capabilities for handling electronic design for placement, routing, post-route optimization or modification, or an ECO (engineering change order) process.

In some embodiments, the method illustrated in FIG. 5 may include the process 504 of identifying a set of available track patterns that include a non-uniform track pattern. A non-uniform track pattern includes multiples sets of tracks with different spacing values or constraints in some embodiments. In some embodiments, process 504 identifies the set of available track patterns from a library even though some or all of the set of available track patterns may or may not have been assigned or mapped to the region for subsequent use. In some embodiments, the method illustrated in FIG. 5 may include the process 506 of identifying a circuit component for physical implementation in the region. In some of these embodiments, the circuit component may include a shape, a block of circuit elements (e.g., a macro or an IP block), a wire, a via, or any other collections of circuit elements.

In some embodiments, the method illustrated in FIG. 5 may include the process 508 of dynamically or interactively modifying the set of available track patterns based at least in part on the physical implementation or one or more characteristics of the circuit component. In these embodiments, physical implementation for the component may include adding the circuit component to the region, removing the circuit component from the region, or modifying the circuit component. In some of these embodiments, the dynamic, interactive modification of the set of available track patterns at 508 is performed during but before the completion of the physical implementation of the circuit component. For example, a user may place or move a cell in the region by dragging the cell with an input device (e.g., a computer mouse) within the graphical display area of a user interface, process 508 may interactively, dynamically modify the set of available track patterns based at least in part upon, for example, the current location of the circuit component at an instant. In this example, moving the cell instance in the region may change the track pattern assignment because the cell may contain certain track pattern(s) and thus the track patterns assigned to the region in which the cell is to be implemented need to conform to the requirements of such certain track pattern(s) in the cell instance.

In some embodiments, the method illustrated in FIG. 5 may include the process 510 of automatically snapping the circuit component to one or more active tracks in the set of available track patterns. More details about automatically snapping the circuit component to one or more active tracks will be provided in subsequent paragraphs with reference to FIGS. 6A-C.

Figure 6A:
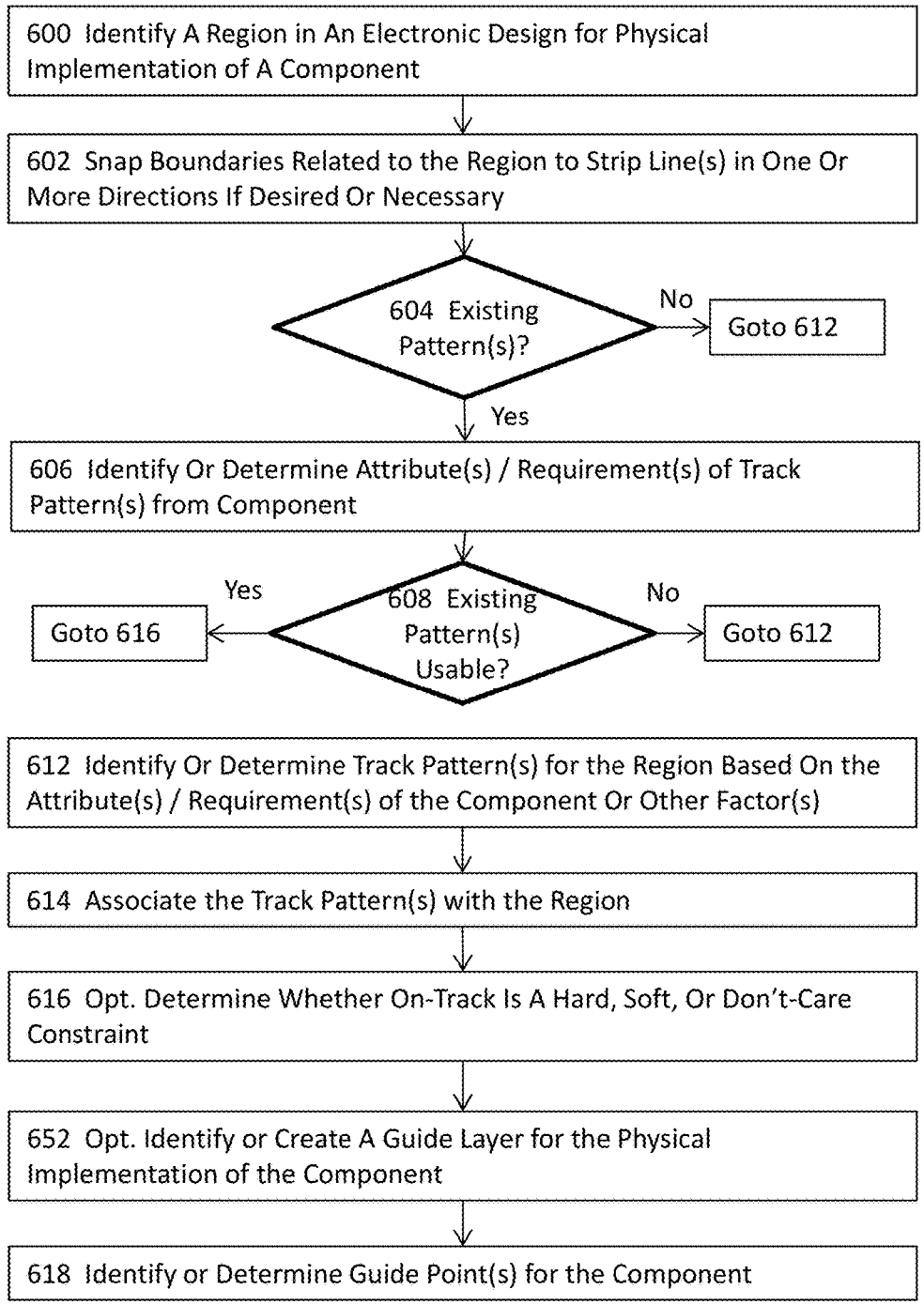
FIGS. 6A-C jointly illustrate a more detailed flow diagram for interactively implementing physical electronic designs with track patterns in some embodiments.
Figure 6B:
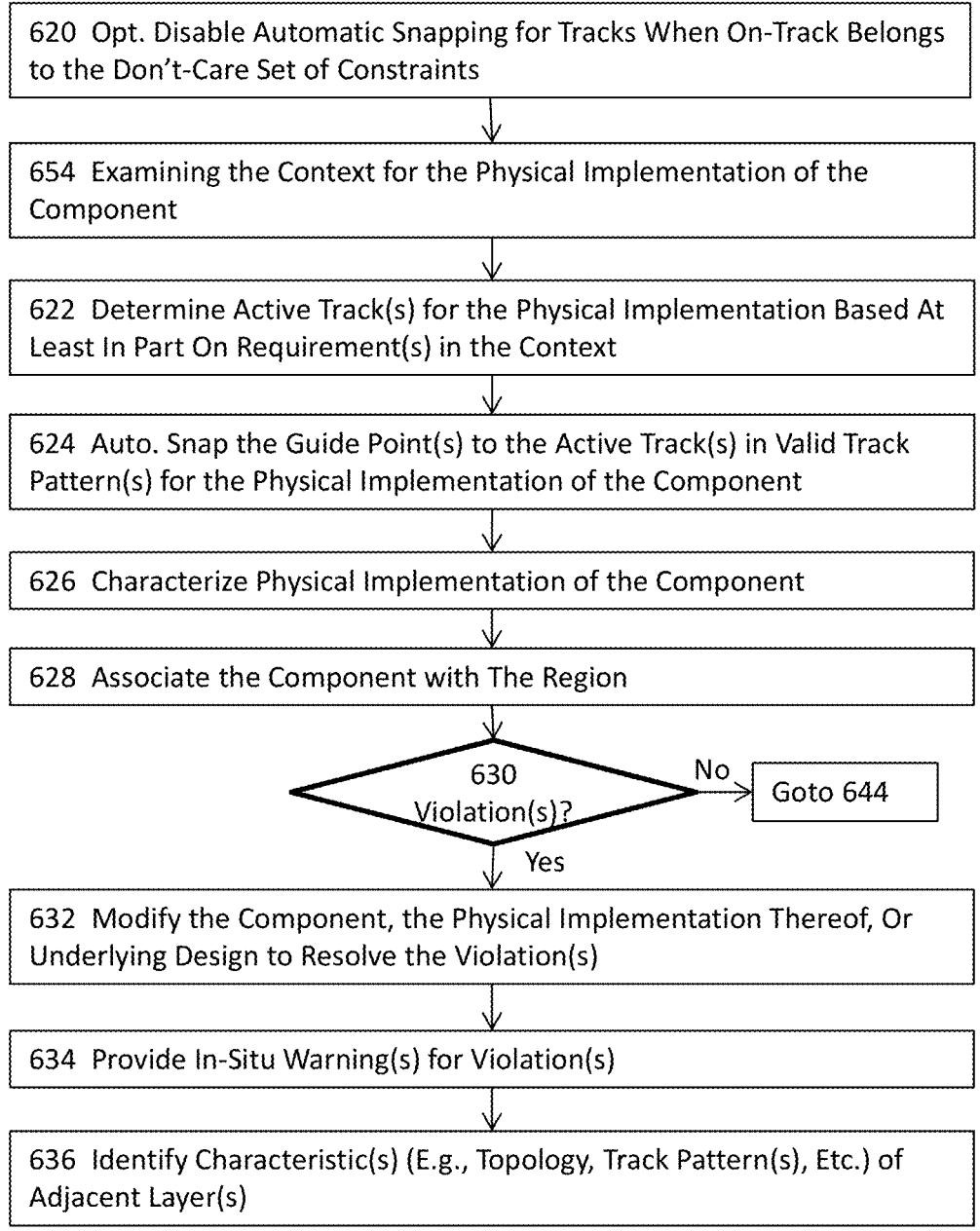
Figure 6C:
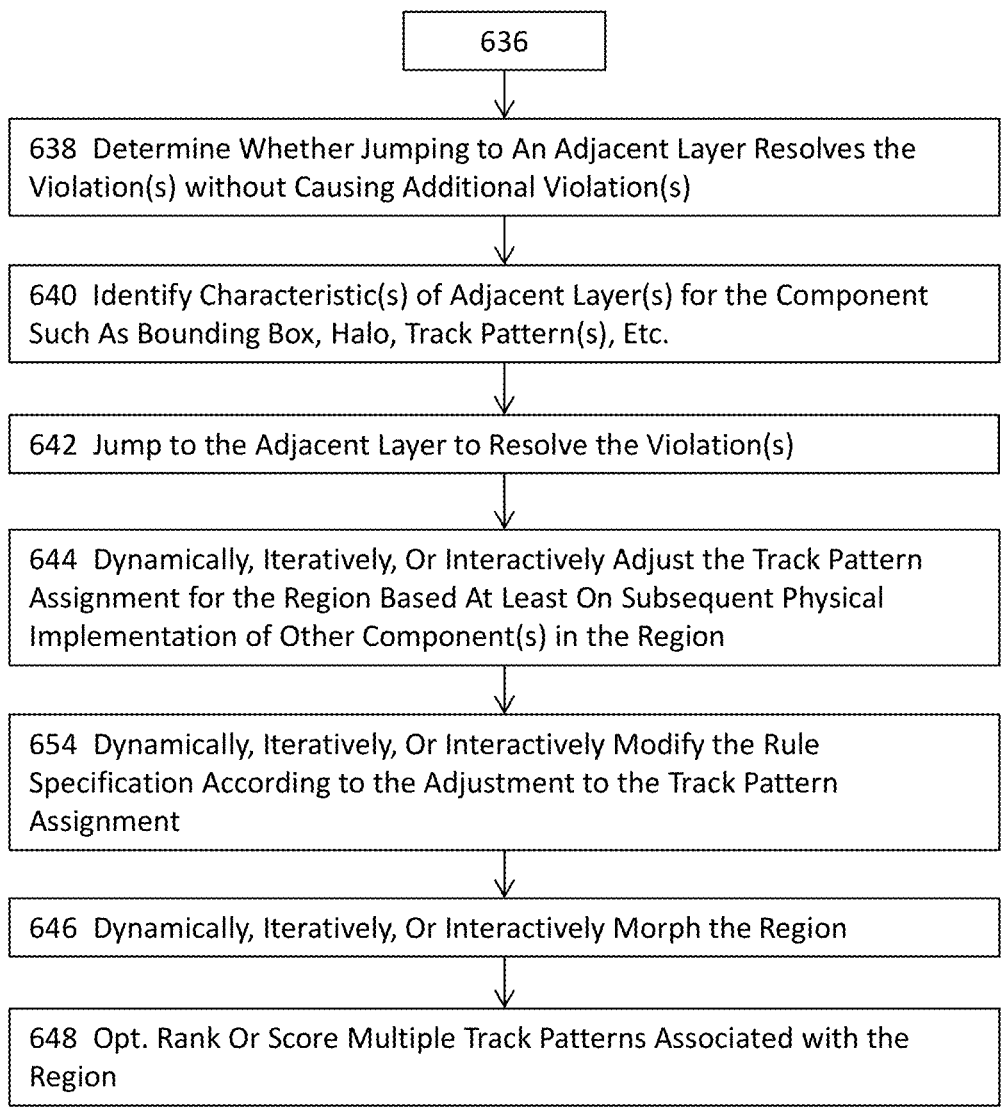

FIGS. 6A-C jointly illustrate a more detailed flow diagram for interactively implementing physical electronic designs with track patterns in some embodiments. In one or more embodiments, the method may include the process 602 of identifying a region in an electronic design for physical implementation of a component. Process 600 may be performed in substantially similar manners as those described above with references to FIGS. 2-4. In some embodiments, the method may include the process 602 of snapping the boundaries that are related to the region to strip line(s) in one or more directions if desired or necessary. Process 604 may be performed in substantially similar manners as those described above for 424 of FIGS. 4A-B, 310 of FIG. 3, and 206 of FIG. 2.

In some embodiments, the method may include the process 604 of determining whether one or more track patterns have been assigned to the region. In these embodiments, process 604 may determine whether the area of the electronic design including the region has already been tessellated into strips or even regions to which the region identified at 600 belongs. If process 604 determines that there are no existing track patterns assigned to the region, the method may proceed to 612. Otherwise, the method may proceed to 606.

In some embodiments, the method may include the process 606 of identifying or determining one or more attributes or requirements of one or more track patterns from the component. In some embodiments where the component comprises a block of circuit elements having interconnects routed according to one or more track patterns, process 606 may identify or determine, for example but not limited to, the width(s), spacing value(s), starting location(s), the number(s) of repetitions, orientation(s), related constraint(s), etc. of the one or more track patterns of the component.

In some embodiments, the method may include the process 608 of identifying or determining whether the one or more existing track patterns identified or determined at 604 may be used for the physical implementation of the component in the region, if such an existing track pattern is assigned to the region. For example, process 608 may identify the width, spacing, the number of repetitions, or starting location attribute in an existing track pattern to determine whether such an attribute or attributes match those required by the component—an instance of an IP block or even a single interconnect. In some embodiments where process 608 determines that some of the one or more existing track patterns may be used for the physical implementation of the component in the region, the method proceeds to 616. Otherwise, the method proceeds to 618.

In some embodiments, the method may include the process 612 of identifying or determining one or more track patterns for the region based at least in part on one or more attributes or one or more requirements of the component or other factor(s). Similar to the example illustrated above for 608, process 612 may also identify the width attribute, the spacing attribute, the number of repetitions attribute, or the starting location attribute in a track pattern to determine whether such an attribute or attributes match those required by the component.

In some embodiments, the method may include the process 614 of associating, assigning, or mapping the track pattern(s) with the region. Unless otherwise expressly specified, associating a track pattern with, assigning a track pattern to, and mapping a track pattern to a region are used interchangeably throughout the entire description of this application. More details about assigning a track pattern to a region is provided in the four U.S. patent applications filed concurrently and indicated in the CROSS REFERENCE TO RELATED APPLICATION section of this application. In some embodiments, the method may include the process 616 of optionally determining whether the on-track is a hard, soft, or don't-care constraint. An on-track constraint indicates the centerline of a circuit element (e.g., an interconnect or a via) coincides with a track. A hard constraint is one that must be satisfied. A soft constraint is one that is desired to be satisfied. A don't-care constraint is one that is irrelevant to any design rule checks, regardless of whether or not the constraint is satisfied.

In some embodiments, the method may include the process 652 of optionally identifying or creating one or more guide layers for the physical implementation of the component. In some embodiments, process 652 identifies the most restrictive layer (e.g., the metal 1 layer) in the stack of layers of the electronic circuit design as the guide layer. In some embodiments, a guide layer may be used to aid the placement or alignment of the layer (e.g., the layer on which the region resides) under consideration. In some embodiments, a single guide layer may be used for this purpose. In some other embodiments, more than one guide layer may be used for the same purpose. In some embodiments, the method may include the process 618 of identifying or determining one or more guide points for the component. For example, process 618 may identify two guide points for a cell instance such that when the two guide points are aligned, the entire cell instance is placed in the correct location and is aligned in the correct orientation.

In some embodiments, the method may include the process 620 of optionally disabling the automatic snapping for tracks when on-track belongs to the don't-care set of constraints. In some embodiments, process 620 disables the automatic snapping function that automatically snaps a component to a track to provide more flexibility in implementing the electronic design. In these embodiments, the physical implementation tools (e.g., a floorplanner, a placement tool, a router, a post-route optimization tool, or an ECO engine, etc.) may use any tracks or no tracks at all to implement at least a portion of the electronic design while incurring no penalty when certain features do not meet the on-track constraint. In some embodiments where a region is trackless (and hence gridless because grids require tracks in both the preferred direction and the non-preferred directions), process 620 may disable the automatic snapping function or may mark all circuit features implemented as on-track such that these circuit features will meet the on-track constraint even if the on-track constraint is a hard constraint, and even if these circuit features are in fact off-track.

In some embodiments, the method may include the process 654 of examining the context for the physical implementation of the component. In these embodiments, process 654 examines the environment in which the physical implementation of the component occurs. The context may include, for example but not limited to, connectivity requirement(s) to or from the component, the region in which the component is implemented, one or more neighboring regions and their respective relationships with the region in question, or one or more requirements for the physical characteristics of the component (e.g., width(s), spacing value(s), repetitions, etc.) For example, process 654 may examine the context for the physical implementation to identify or correlate, for example but not limited to, the component and the region in which the component is to be implemented.

In some embodiments, the method may include the process 622 of determine one or more active tracks for the physical implementation of the component based at least in part on the context. For example, process 620 may identify that the component is to include a 1x-width wire at a specific location for interconnection purposes. In this example, process 622 may identify the appropriate 1x-track from a track pattern that can be used to implement the 1x-width wire of the component. As another example, process 622 may identify the appropriate 2x-track from a track pattern that can be used to implement the 1x-width wire of the component where the design rule allows the use of 2x-track to implement a 1x-width wire.

In some embodiments, the method may include the process 624 of automatically snapping the one or more guide points to the one or more active tracks in the one or more valid track patterns for the physical implementation of the component. For example, process 624 may align the one or more guide points to one or more active tracks such that the centerlines of the interconnects of the component coincide with the respective tracks while satisfying all the constraints for the interconnects of the component. A track (e.g., a routing track) includes an imaginary line that spans at least across the region of interest and thus has no width in some embodiments. Nonetheless, various embodiments may associate a track with a width constraint or attribute such that only interconnects satisfying the width constraint or attribute may be implemented by using the track in these embodiments.

In some embodiments, the method may include the process 626 of characterizing the physical implementation of the component. In some embodiments, process 626 characterizes the physical implementation to determine, for example, whether the physical implementation comprises moving the component or the impact of the physical implementation on snapping or track pattern assignment. For example, process 626 may characterize a placement process for the component and determine that the placement process may move the component to an extent that changes the assignment of one or more track patterns to a region in which the component is placed.

In some embodiments, the method may include the process 628 of associating the component with the region. In some embodiments, process 628 associates the component with the region to track the physical implementation of the component and its impact on, for example, track pattern assignment for the region. In these embodiments, the method may then determine whether to modify the component, to switch to a new component, or to modify the surrounding design while leaving the component unchanged based on the association between the component and the region. In some embodiments, process 628 may associate the component with the region by using a pointer, a symbolic link, or any other linking structure.

In some embodiments, the method may include the process 630 determining whether there are any violations in using the assigned track patterns for the physical implementation of the component. For example, the process may determine whether the current assignment of one or more track patterns, when used for the physical implementation of the component, may cause a violation (e.g., implementing a 2x-width wire on a 1x-track). In some embodiments, process 630 makes such determination during the performance and prior to completion of the physical implementation. For example, process 630 may determine whether there are any violations while a user is dragging a cell instance within a region before the user finally places the cell instance at a drop location.

In some embodiments, the method may include the process 632 of modifying the component, the physical implementation thereof, or underlying design to resolve the violations. In the example provided above for 630, process 632 may decide whether to change the component or to change the existing design in the region in which the component is to be implemented in order to resolve or fix the violations. In some embodiments, the method or the process 632 may also reform the region in which the component is to be implemented.

In some embodiments, the method may include the process 634 of providing in-situ warning(s) for violation(s). In some embodiments, process 634 may provide textual feedback showing specifics of the violations or graphical cues illustrating the violations. In some embodiments, process 634 presents the warning during the performance and prior to completion of the physical implementation. In the above example provided for 630, process 634 may provide such in-situ warnings for the violations while the user is dragging a cell instance within a region before the user finally places the cell instance at a drop location.

In some embodiments, the method may include the process 636 of identifying one or more characteristics (e.g., the topology, one or more track patterns, etc.) of one or more adjacent layers. For example, process 636 may examine an adjacent layer to identify the track pattern or the extent of the track pattern covered area for the area that corresponds to the location at which the component is being or to be implemented. Such information may be further used by, for example, process 638 to determine whether jumping to the adjacent layer constitutes a viable option.

In some embodiments, the method may include the process 638 of determining whether jumping to an adjacent layer resolves the violations without causing additional violations. In the example provided above for 636, process 638 may use the one or more characteristics from 636 to determine whether there are active tracks and sufficient real estate on the adjacent layer to insert vias such that the physical implementation of the component (e.g., a wire) may jump to the adjacent layer to continue routing and then return to the current layer to complete the physical implementation without producing additional violations.

In some embodiments, the method may include the process 640 of identifying one or more characteristics of one or more adjacent layers for the component. In some embodiments, the one or more characteristics include, for example but not limited to, the same bounding box or different bounding boxes for the component on these two layers, the same halo or different halos for the component on these two layers, or the one or more track patterns assigned to each of these two layers, or any other characteristics that may affect the snapping, the track pattern assignment, or the physical implementation of the component, etc.

In some embodiments, the method may include the process 642 of jumping to the adjacent layer to resolve the violations. In these embodiments, process 642 may cooperate with the router to insert the vias at the appropriate locations to proceed from the current layer to the adjacent layer through a first via, continue the physical implementation on the adjacent layer, and return to the current layer through a second via to complete the physical implementation.

In some embodiments, the method may include the process 644 of dynamically, iteratively, or interactively adjusting the track pattern assignment for the region based at least on subsequent physical implementation of other component(s) in the region. In some embodiments, process 644 may dynamically, iteratively, or interactively adjusting the track pattern assignment by, for example, changing the labeling for the region or changing the mapping between the track patterns and the region.

In some embodiments, the method may include the process 654 of dynamically, iteratively, or interactively modifying the rule specification according to the adjustment to the track pattern assignment. The rule specification includes the specification of various constraints or attributes for track patterns such as spacing, start location, number of repetitions, constraint(s), etc. in some embodiments. More details about the rule specification are described in the four U.S. patent applications filed concurrently and indicated in the CROSS REFERENCE TO RELATED APPLICATION section of this application.

In some embodiments, the method may include the process 646 of dynamically, iteratively, or interactively morphing the region. For example, process 646 may cause the boundaries related to the region to be snapped to another strip line to determine whether the violations may be fixed in some embodiments. In some embodiments, the method may include the process 648 of optionally ranking or scoring multiple track patterns associated with the region. In some embodiments, process 648 may rank or score multiple track patterns based at least in part on their respective likelihood, matches with shapes in the electronic design, scores derived from matches, or the adjustment. More details about ranking or scoring track patterns are described in the four U.S. patent applications filed concurrently and indicated in the CROSS REFERENCE TO RELATED APPLICATION section of this application.

Figure 7A:
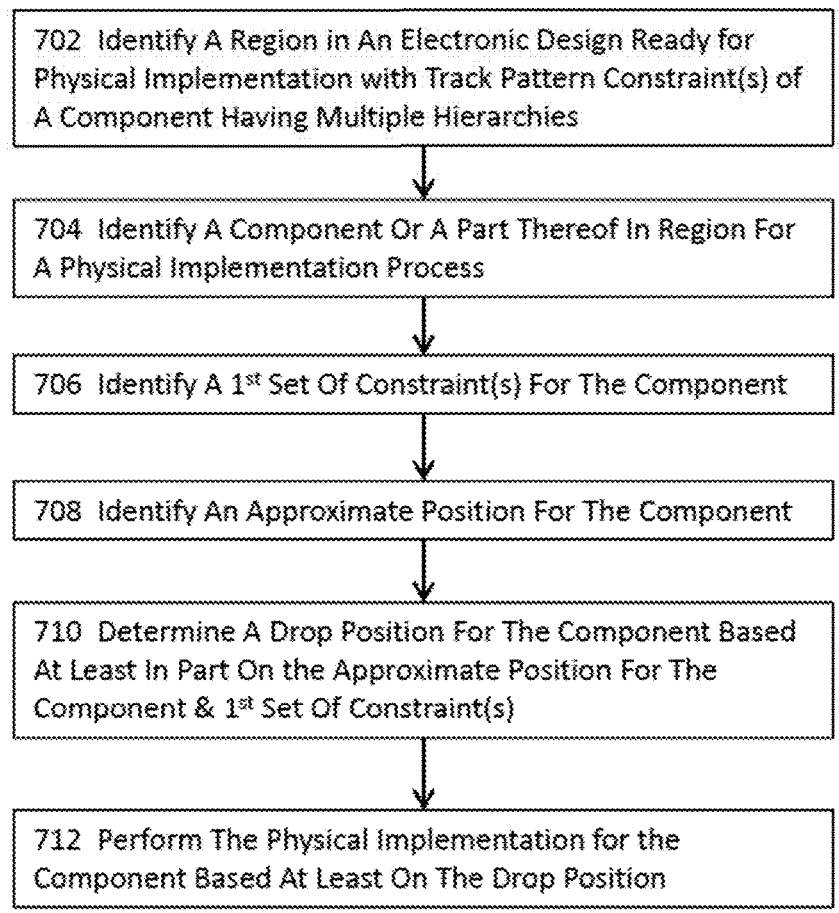

FIGS. 7A-B illustrate another more detailed flow diagram for interactively implementing physical electronic designs having track patterns using automatic snapping in some embodiments. More specifically, FIG. 7A illustrates a flow diagram for interactively implementing physical electronic designs having track patterns using automatic snapping in some embodiments. In one or more embodiments, the method for interactively implementing physical electronic designs having track patterns using automatic snapping may comprise the process 702 of identifying a region in an electronic design ready for physical implementation with track pattern constraint(s) of a component having multiple hierarchies. In some embodiments where the region is determined not to be ready for physical implementation with track pattern constraint(s) of a component, the method may invoke various processes described above with reference to FIGS. 2-6 to prepare the region to be ready for such tasks.

In some embodiments, the method may comprise the process 704 of identifying a component or a part thereof in a region for a physical implementation process. In some embodiments, the physical implementation process includes adding, removing, or modifying the component.

In some embodiments, the method may comprise the process 706 of identify a first set of one or more constraints for the component. In some embodiments, the set of one or more constraints comprises, for example but not limited to, a complex constraint involving multiple objects (e.g., geometric objects, interconnects, nets, etc.), a net-based constraint (e.g., a net-to-net spacing constraint), a multi-valued constraint (e.g., a voltage-based constraint that imposes different, for instance, different spacing values for different operating voltages or a spacing constraint depending upon parallel run-lengths between two adjacent objects) whose values are defined by a data structure (e.g., a table) instead of a single value, or a corner-to-corner constraint between two adjacent objects in addition to the spacing constraint between these two object, etc.

An example of a net-based constraint may comprise, for example, the permissible spacing between a clock net and a power net. In some embodiments where a net-based spacing constraint is involved, the method or system examines the minimum spacing between a first net and a second net and determines whether the first net and the second net satisfy the net-based spacing constraint. In some embodiments, a voltage-based constraint, which imposes, for example, different spacing values based on different operating voltages may be considered a part of a sub-set of net-based constraints because the operating voltages may depend upon the knowledge of the relevant net or connectivity information.

In some embodiments, the method may comprise the process 708 of identify an approximate position for the component. For example, the first approximate position may comprise the location or orientation in which the method or system attempts to place the component in the layout. In some embodiments, the first approximate position comprises one or more intermediate positions of the component in the layout during the performance of the physical implementation process.

In some embodiments, the method may comprise the process 710 of determine a drop position for the component based at least in part on the approximate position for the component and first set of one or more constraints. In some embodiments, the drop position comprises the location or orientation in which the method or system actually places the component in the layout. In some embodiments, the drop position is within certain proximity of the approximate position and comprises a node that has been analyzed to result in a clean electronic design with an identical or substantially similar component at its location with an orientation. In these embodiments, the method or system may automatically snap the component to the drop position when the physical implementation process on the component attempts to place the component in the approximate position.

In some embodiments, the method or system may present a plurality of options for snapping to a designer and allow the designer to select from the plurality of options to snap the component to another component. The method or system may then snap the component to the another component according to the designer's selection in these embodiments. In some of these embodiments, the method or system may also snap the component to the another component according to the designer's selection even with the possibility that such snapping may result in a constraint violation. In some embodiments, the method may comprise the process 712 of performing the physical implementation for the component based at least on the drop position.

FIG. 7B illustrates another more detailed flow diagram for interactively implementing hierarchical physical electronic designs having track patterns using automatic snapping in some embodiments. In one or more embodiments, the method for interactively implementing physical electronic designs having track patterns using automatic snapping may comprise the process 752 of identify a region in an electronic design ready for physical implementation with one or more track pattern constraints of a component having multiple hierarchies. In some embodiments where the region is determined not to be ready for physical implementation with track pattern constraint(s) of a component, the method may invoke various processes described above with reference to FIGS. 2-6 to prepare the region to be ready for such tasks. In some embodiments, the method may comprise the process 754 of identifying hierarchical layers of the component that are governed by one or more track pattern constraints.

In some embodiments, the method may comprise the process 756 of identifying the relative locations among the hierarchical layers. With the identification of the relative locations of the hierarchical layers, all the hierarchical layers of the component can be placed once a single hierarchical layer is placed. In some embodiments, the method may comprise the process 758 of determining a set of one or more available track patterns for each of the hierarchical layers of the component subjected to at least some of the track pattern constraints.

In some embodiments, the method may comprise the process 760 of determining a reduced set of track patterns from the set of available one or more track pattern patterns for each of the hierarchical layers. As described above with reference to FIGS. 2-6, the more factors that the method considers in determining valid track patterns or the more complete of the physical implementation is, the fewer the number of track patterns that may be assigned to a region will be. In some embodiments, the method may comprise the process 762 of identifying one or more guide points for the component on a hierarchical layer. Process 762 may be performed in substantially similar manners as that described for 652 of FIGS. 6A-B.

In some embodiments, the method may comprise the process 764 of identify a set of requirements governing the physical implementation of the component in the hierarchical layer. In some embodiments, the set of requirements may include, for example but not limited to, any of the track pattern attributes, constraint(s), design rule(s), etc. for the hierarchical layer or for one or more adjacent hierarchical layers. In some embodiments, the method may comprise the process 766 of identifying one or more active tracks on the hierarchical layer based at least in part upon some of the set of requirements.

In some embodiments, the method may comprise the process 768 of automatically snapping the one or more guide points to the one or more active tracks in the reduced set of track pattern(s) for the physical implementation of the component. The process 768 may be performed in substantially similar manner as that described for 624 of FIGS. 6A-C. In some embodiments, the method may comprise the process 770 of completing the physical implementation of the component based at least in part on the automatic snapping of the one or more guide point(s) and the relative locations.

Figure 8:
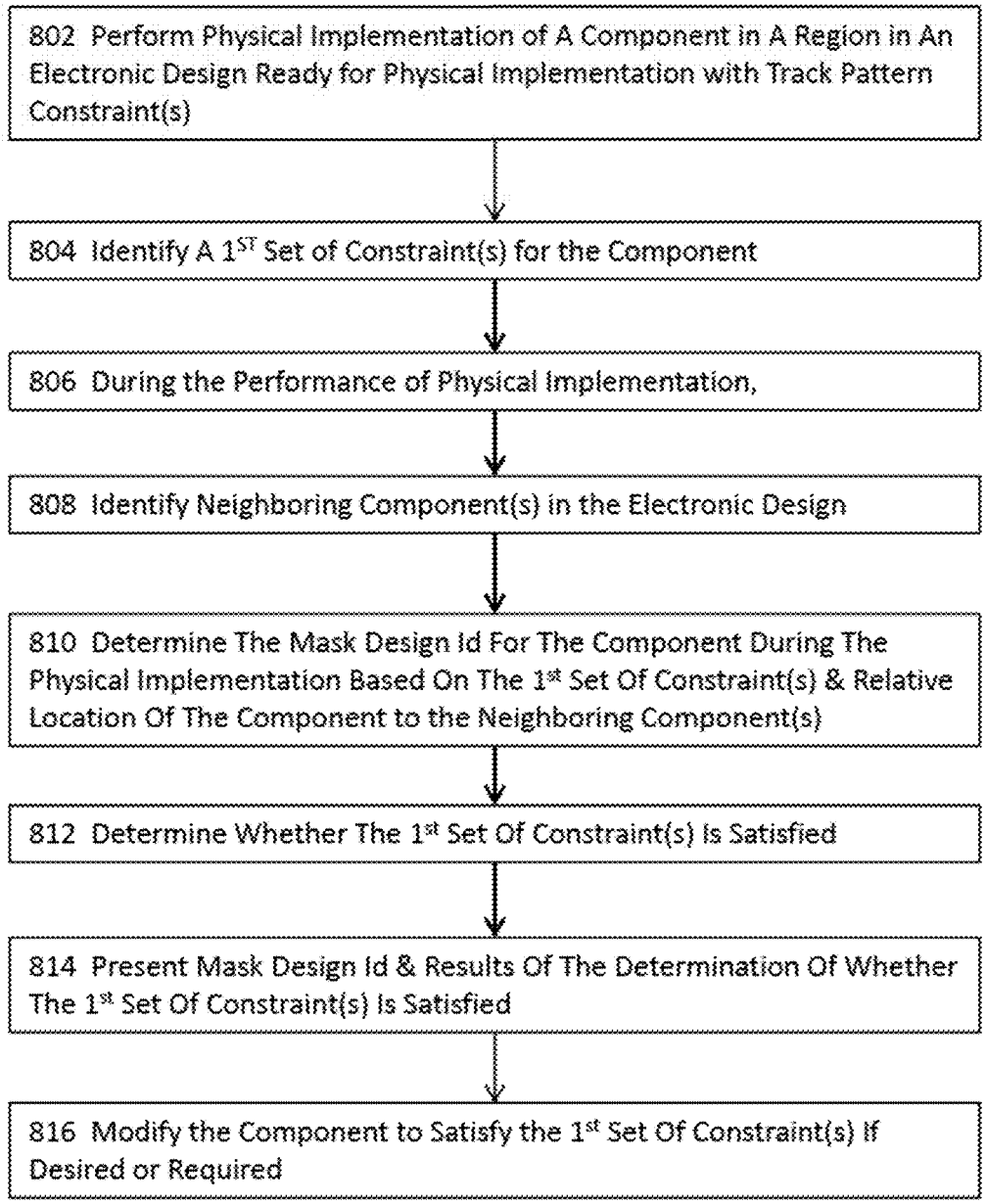
FIG. 8 illustrates a more detailed flow diagram for implementing interactive coloring of physical design components in a physical electronic design having one or more track patterns with multiple-patterning techniques awareness in some embodiments.

FIG. 8 illustrates a more detailed flow diagram for implementing interactive coloring of physical design components in a physical electronic design having one or more track patterns with multiple-patterning techniques awareness in some embodiments. In some embodiments, the method or system may comprise the respective process or module 802 of performing the physical implementation of a component in a region in an electronic design ready for physical implementation with one or more track pattern constraints. In some embodiments, the component represents a dynamic object that is subject to the physical implementation process that may add, remove, or modify the component. In some embodiments where the region is determined not to be ready for physical implementation with one or more track pattern constraints of a component, the method may invoke various processes described above with reference to FIGS. 2-6 to prepare the region to be ready for such tasks.

A physical implementation may include, for example but not limited to, creating or adding, removing, translating, rotating, mirroring, resizing the geometric shape in the physical design or placement, routing, or post-route optimization. On the other hand, a static component represents a component whose position (e.g., location, orientation, etc.) remains unchanged in an electronic design, at least during the physical implementation for a dynamic component. In some embodiments, the method or system may comprise the respective process or module 804 of identifying one or more sets of constraints that are related to, associated with, or may be applied to the component.

In some embodiments, the method or system may comprise the respective process or module 806 of performing the physical implementation for the component to generate one or more changes in the component or in the remaining portion of the electronic design. The one or more changes include, for example but not limited to, a change in location, orientation, shape, or size of the component or other portion of the electronic design, an addition of the component to the electronic design, a removal of the component or one or more other component in the electronic design, etc. In some embodiments, the method or system may comprise the respective process or module 808 of identifying one or more neighboring component in the electronic design. In some embodiments, the method or system identifies the component(s) in the current view window as the one or more neighboring component.

In some embodiments, the method or system identifies the component(s) within a range or radius of influence with respect to a reference node (e.g., the component or any other suitable reference points in the electronic design) as the one or more neighboring component. In some embodiments, the method or system may comprise the respective process or module 810 of determining the mask design identification for the component. In some of these embodiments, the method or the system identifies the mask design identification for the component during the physical implementation of the first object and thus may provide interactive or nearly real-time feedback to the user with the information indicating which mask design the first object may be printed with at any given point in time during the physical implementation of the component.

In some embodiments, the method or system may comprise the respective process or module 812 of determining whether the one or more relevant constraints are satisfied with the component. In some embodiments, the method or system determines whether the one or more relevant constraints are satisfied during the performance and before the completion of the physical implementation to provide interactive feedback for the compliance or violation of the one or more relevant constraints while the physical implementation is being performed for the component. In some embodiments, the method or system may comprise the respective process or module 814 of presenting the mask design identification or the results of the process or module 812 of determining whether the one or more relevant constraints are satisfied. In some embodiments, the method or system presents the results or the mask design identification to a user via, for example, a user interface.

Figure 9:
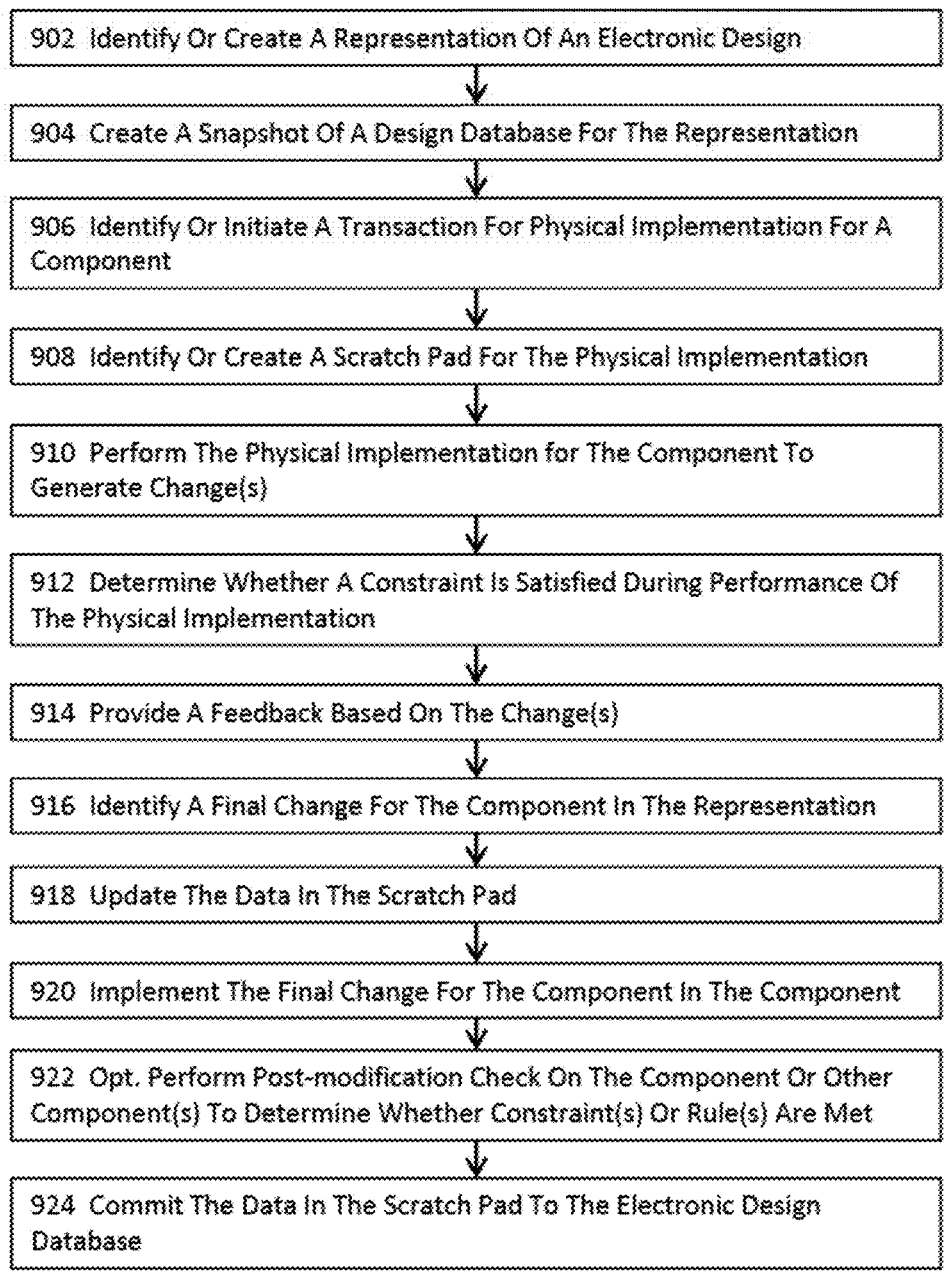
FIG. 9 illustrates a flow diagram for implementing interactive, real-time checking or verification of constraints during the physical implementation of an electronic design having one or more track patterns in some embodiments.

FIG. 9 illustrates a flow diagram for implementing interactive, real-time checking or verification of constraints during the physical implementation of an electronic design having one or more track patterns in some embodiments. In one or more embodiments, the method or system may comprise the respective process or module 902 of identifying or creating a representation of an electronic design. In some embodiments, the representation may comprise a partial, incomplete layout which will fail the layout-versus-schematic check and may include, for example, only a single net or a part thereof, or one or more components, but not all, of a single net. In some embodiments, the method or system may further identify an object (or component) in the representation. An object may comprise, for example but not limited to, a geometric shape, an interconnect or a portion thereof, a cell instance, or a smaller portion of the electronic circuit design, etc. in some embodiments.

In some embodiments, the method or system may comprise the respective process or module 904 of creating a snapshot of a design database for the representation that is being manipulated. In some embodiments, the method or the system may create a snapshot of one or more design databases at a certain point in time before performing other processes or invoking other modules described herein to preserve the states of these one or more design databases. In the cases when some additional editing or modifications cause issues with the one or more databases, the method or the system may use the snapshot of the one or more databases to restore the one or more databases to some prior states.

In addition or in the alternative, the method or the system may further maintain one or more log records, such as one or more undo logs, one or more redo logs, one or more state logs to keep track of the modifications made to the one or more design databases. In the event of certain modifications causing some undesired changes to any of the one or more databases, the method or the system may also use the one or more log records to restore the one or more databases to a desired point in time by applying at least some of these log records to the one or more databases. In addition or in the alternative, the method or the system may implement one or more temporal databases in which one or more pieces of data for a database objects are stored at one or more different time points. In the event of certain modifications causing some undesired changes to the electronic design, the method or the system may identify one or more known, good pieces of data and refresh the current data of the one or more databases with these one or more known, good pieces of data.

In some embodiments, the method or system may comprise the respective process or module 906 of identifying or initiating a transaction for a modification process for the object. In some embodiments, the method or the system may implement the process as a database transaction that comprises a single, logical operation on the data of the one or more databases and observes the ACID (atomicity, consistency, isolation, and durability) properties to guarantee the modification process is processed reliably. In these embodiments, the method or the system or the designer may determine whether or not the outcome of the modification is to be committed or scratched by using various database techniques. In the event that certain modifications cause some undesired effects, the method or the system may undo the modification process by using some database techniques to preserve the integrity, reliability, or stability of the one or more databases.

In some embodiments, the method or system may comprise the respective process or module 908 of identifying or creating one or more scratch pads for a modification process. In some embodiments, a scratch pad comprises one or more blocks of a non-transitory volatile computer accessible medium (e.g., random access memory or RAM) for temporarily storing data or information thereupon. In some embodiments, all the processes, modules, and tools (e.g., the schematic design tool, a physical design tool, a constraint verification tool, etc.) share one or more scratch pads along with other resources such as the design databases. In some other embodiments, a process, module, or tool may have its own one or more scratch pads for storing thereupon various data or information temporarily, while some other processes, modules, or tools share one or more other scratch pads along with other resources.

In some embodiments, each process, module, and tool has its own one or more dedicated scratch pads. In some embodiments, the method or the system may further comprise the process or module of populating at least a part of the one or more databases of the layout in at least some of the one or more databases of the electronic design such that various processes or module may access the design data from the one or more scratch pads. In these embodiments including the process or module 908, the method or the system may perform various operations on the data in the electronic design completely within the one or more scratch pads such that the persistent data in the one or more databases of the electronic design may be preserved. In some embodiments, the method or system may comprise the respective process or module 910 of performing the modification process on the object to generate one or more changes in the layout.

In some embodiments, a modification process for an object includes, for example but not limited to, translation, rotation, mirroring, resizing, deformation, change(s) in configuration (e.g., number of fingers of a CMOS or complementary-metal-oxide-semiconductor device), etc. In these embodiments, the one or more changes include one or more changes in the location, orientation, size, shape, or configuration of the object arising out of the modification process. In some embodiments, the method or system may comprise the respective process or module 912 of determining whether a constraint is satisfied.

In some embodiments, a constraint may comprise, for example but not limited to, a voltage-based constraints that imposes different, for example, spacing requirements between the first net and other net(s) based on the operating voltages, a net-based constraint that imposes some restrictions or limitations on two or more nets, a connectivity based constraint that needs not only the geometric characteristics of one or more shapes in a layout but also the connectivity information of these one or more shapes to determine whether the connectivity-based constraint is satisfied, a constraint defined by a list of permissible values rather than a single value (e.g., a spacing rule defined by a table of values based on, for example, parallel run-lengths), a constraint involving multiple shapes and multiple geometric characteristics of each of these multiple shapes (e.g., a constraint imposing a spacing requirements between two adjacent shapes as well as corner-to-corner requirements between these two adjacent shapes), etc.

In some embodiments, the method or the system determines whether a constraint is satisfied during the performance of the modification process on the object. In other words, the method or system performs one or more checks to determine whether the constraint is satisfied in nearly real-time while the modification process is being performed on the object. In some embodiments, the method or system may comprise the respective process or module 914 of providing a feedback for the one or more changes. In some embodiments, the feedback may comprise a hint or a recommendation for how to address or resolve some negative effects (if any) arising out of the one or more changes.

In some embodiments, the feedback may be presented to a designer via a user interface. With the nearly real-time determination of whether a constraint is satisfied, the method or system may thus provide an interactive response to a modification process on the layout in a nearly real-time manner. In some embodiments, the method or system may comprise the respective process or module 916 of identifying a final change for the object in the layout. In some embodiments, the method or system may identify such a final change for the object based at least in part upon the feedback provided at 914.

For example, if a modification process attempts to place an object or to change the location of the object to a candidate location which may cause some issues with the layout, the method or process may recommend another location within certain proximity of the candidate location as the final location. As another example, the method may, depending upon the candidate location regardless of whether or not this candidate location may cause some issues, recommend another location within certain proximity of the candidate as the final location if the another location has previously been analyzed to constitute a good design. In either examples, the method may automatically place the object at the another location or may await a designer's approval for the another location.

In some embodiments, the method or system may comprise the respective process or module 918 of updating the data in the scratch pad based at least in part upon the final change. In these embodiments, the method or system make all modifications to the data or information in the one or more scratch pads without contaminate the persistent design database(s). In some embodiments, the method or system for implementing interactive, real-time checking or verification of constraints may comprise the respective process or module 920 of implementing the final change for the object in the layout.

In some embodiments, the method or system may optionally comprise the respective process or module 922 of performing a post-modification check on the object or on other portion of the layout to determine whether or not the implemented modification process with the final change complies with one or more constraints of the electronic design. These one or more constraints may include, for example, a constraint involving multiple shapes and multiple geometric characteristics of each of these multiple shapes (e.g., corner-to-corner design rules), and a constraint involving multiple nets (e.g., a net-to-net design rule), a constraint based on voltages, or a constraint defined by a list of permissible values, rather than a single value (e.g., a spacing constraint defined by a table of values based on, for example, parallel run-lengths). In some embodiments, the method or system may comprise the respective process or module 924 of committing the data in the one or more scratch pads to the electronic design database(s).

Figure 10:
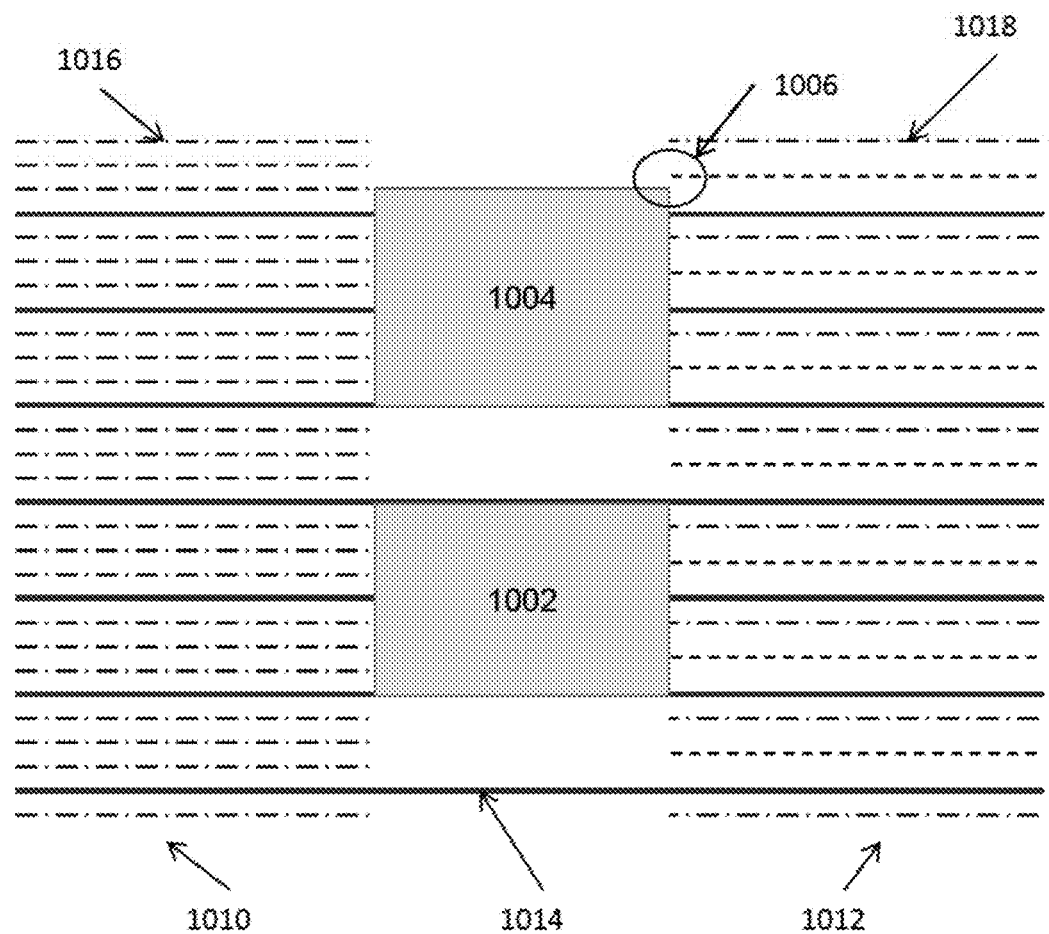
FIG. 10 illustrates a graphical example of region definitions with two track patterns in some embodiments.

FIG. 10 illustrates a graphical example of region definitions with two track patterns in some embodiments. More specifically, FIG. 10 illustrates two track patterns 1010 and 1012, where track pattern 1010 comprises the 1x-tracks 1016 for implementing interconnects having 1x-width, and track pattern 1012 comprises the 1x+1x+2x tracks (1018 for 2x-tracks) for implementing interconnects having 1x-width or 2x-width with the prescribed arrangement. FIG. 10 also illustrates the strip lines 1014 and two defined regions 1002 and 1004. 1002 denotes a region from a good region definition where the upper and the lower boundary of the region are aligned with the strip lines. On the other hand, 1004 denotes a region from a bad region definition where the upper boundary (as shown by 1006) of the region is not aligned with the strip line.

Figure 11A:
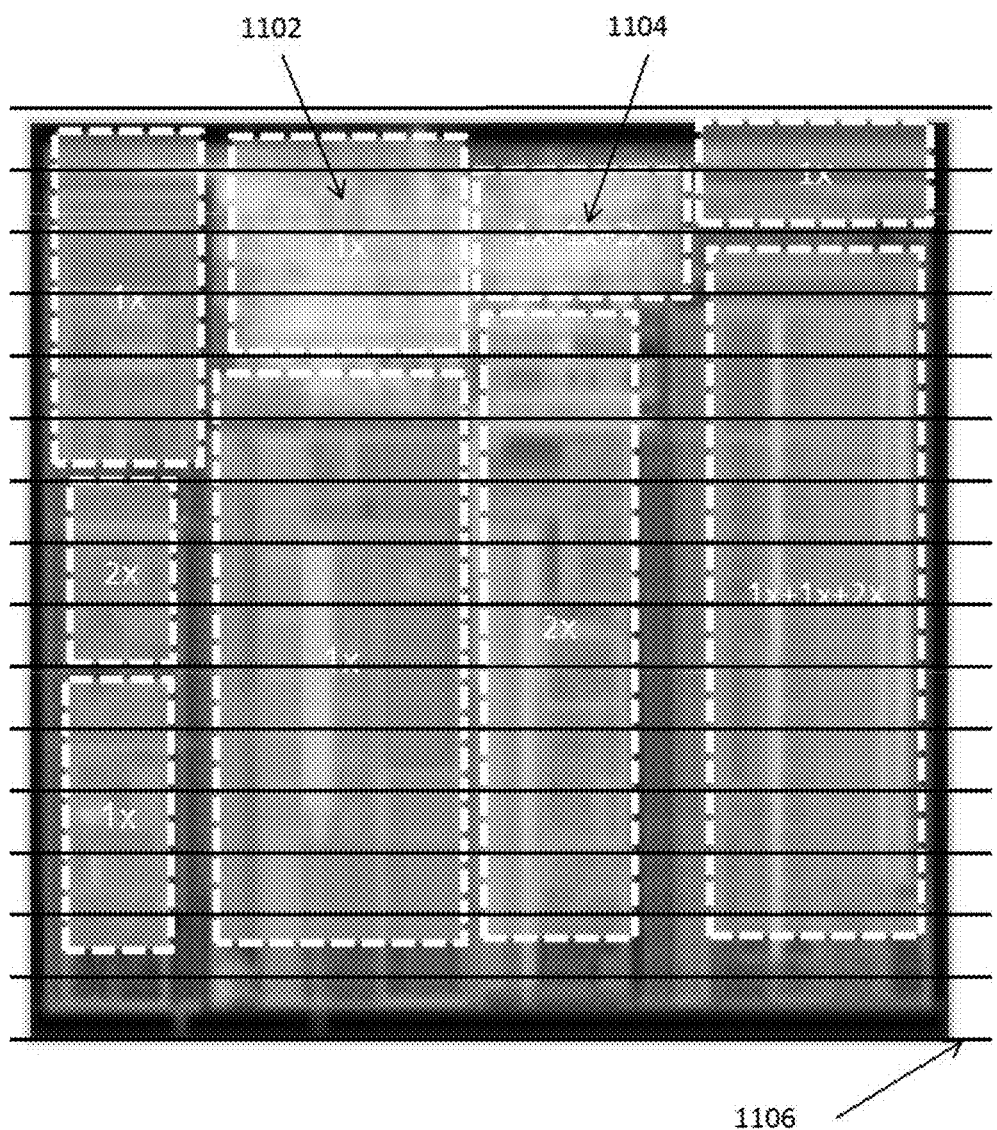
FIGS. 11A-D illustrate examples of creation of regions, tessellation, and generation of regions for track pattern association in some embodiments.

FIGS. 11A-D illustrate examples of creation of regions, tessellation, and generation of regions for track pattern association in some embodiments. More specifically, FIG. 11A illustrates an exemplary floorplan with strip lines 1106 and some regions (e.g., 1102 and 1104). Region 1102 includes the textual description "1x" to indicate that region 1102 is to have 1x-tracks for implementing 1x-width interconnects. Region 1102 is associated with 1x+1x+2x track pattern. It shall be noted that the textual descriptions "1x" and "1x+1x+2x" are presented in FIG. 11A for the purpose of illustration and explanation. The actual mapping, assignment, or association between track patterns and regions may not necessarily be done in the manner illustrated in FIG. 11A.

Figure 11B:
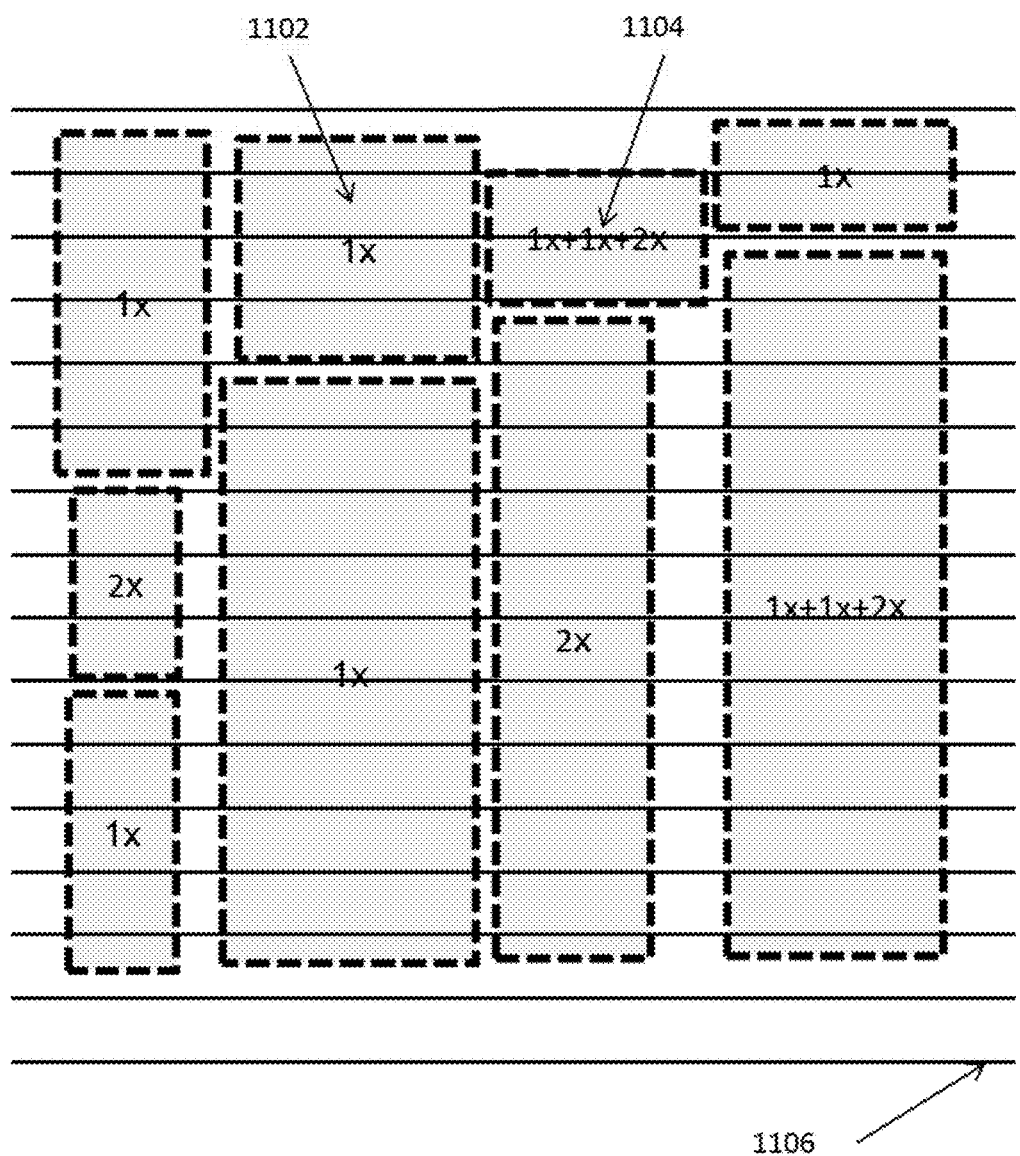
Figure 11C:
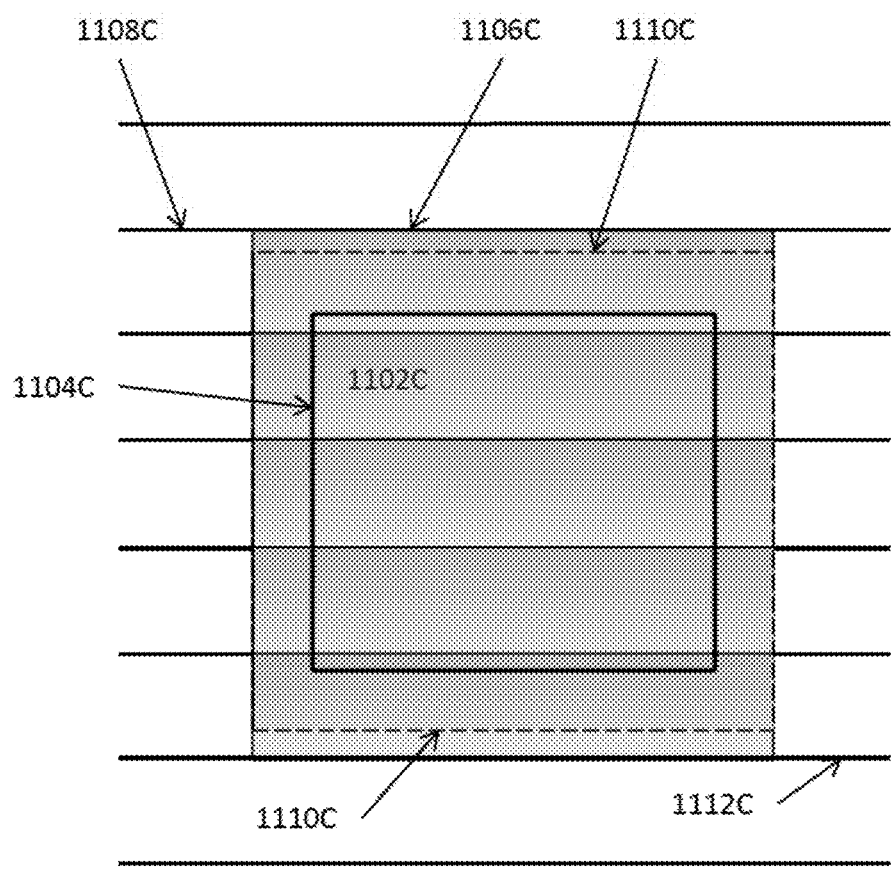
Figure 11D:
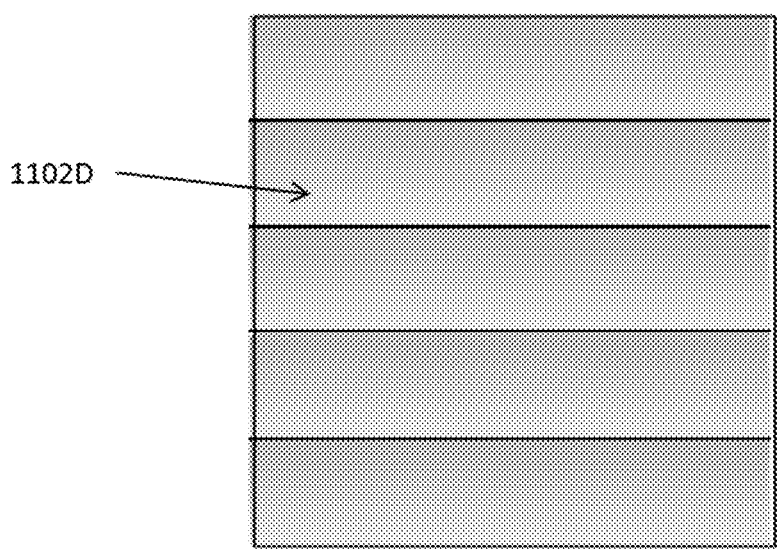

FIG. 11B illustrates primarily the same configuration while the floorplan image overlay is not shown for clarity. FIG. 11C schematically and graphically illustrates a set of strip lines 1108C encompassing a component 1102C with a bounding box as indicated by 1104C. FIG. 11C further illustrates the halo (1110C) extending beyond the bounding box 1104C. According to some embodiments, the boundaries (1110C in this example) related to the component (1102C) are snapped to both the strip line 1108C at the top and the strip line 1112C at the bottom. FIG. 11D illustrates the tessellation pattern of the area enclosed by the snapped boundaries where the strip lines in FIG. 11C are used to tessellate the area into five strips (e.g., 1102D). At least one of these strips may be further tessellated in the vertical direction in some embodiments, Each of these strips may be associated with one or more track patterns.

Figure 12:
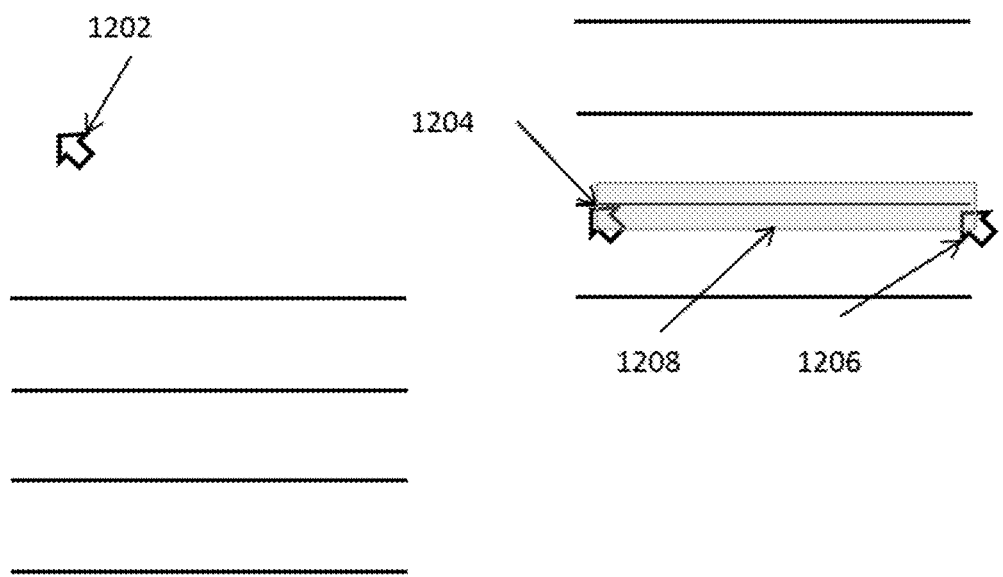
FIG. 12 illustrates a schematic representation of some interactive aspects of the method for implementing physical electronic designs with track patterns in some embodiments.

FIG. 12 illustrates a schematic representation of one interactive aspect of the method for implementing physical electronic designs with track patterns in some embodiments. With the interactive nature of various processes or modules described herein, if a designer manipulates a pointing device from the location 1202, no geometries will be drawn because the area near 1202 is not associated with any track patterns. On the other hand, if the designer manipulates a pointing device from the location 1204 and drags to the location 1206, the geometry 1208 with the correct width will be drawn because of the presence of an active track between 1204 and 1206.

System Architecture Overview

Figure 13:
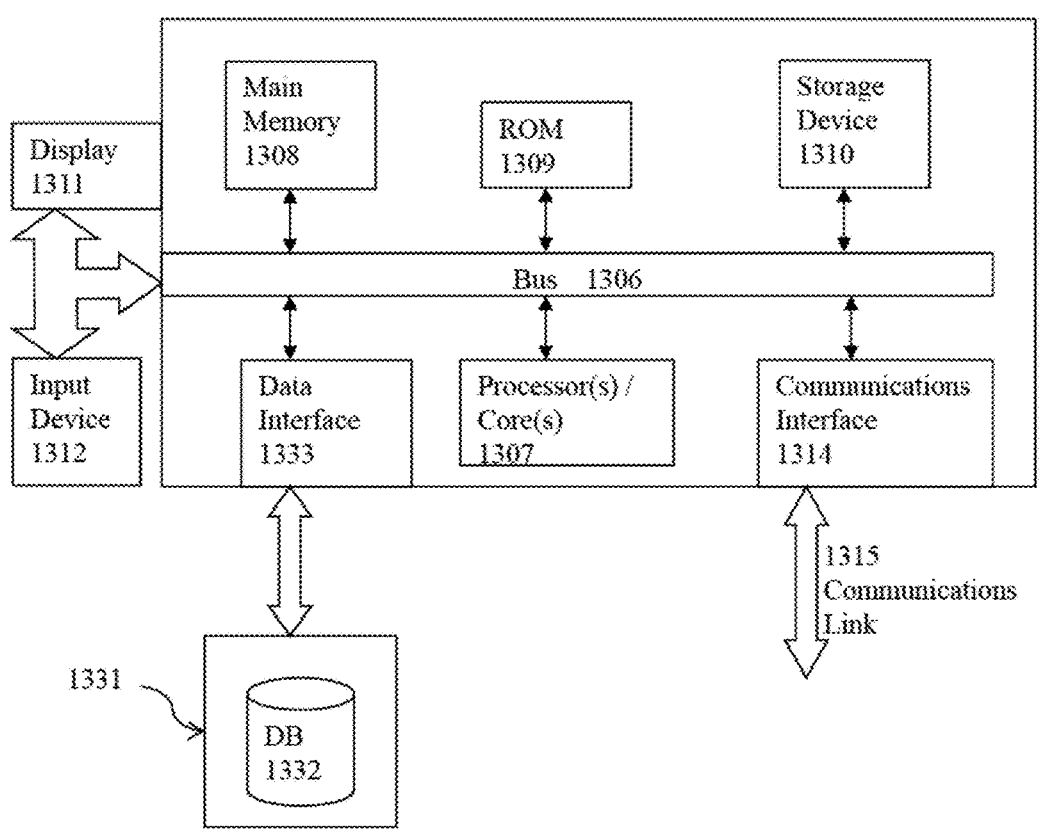
FIG. 13 illustrates a computerized system on which a method for implementing physical electronic designs with track patterns may be implemented.

FIG. 13 illustrates a block diagram of an illustrative computing system 1300 suitable for implementing physical electronic designs with track patterns as described in the preceding paragraphs with reference to various figures. Computer system 1300 includes a bus 1306 or other communication mechanism for communicating information, which interconnects subsystems and devices, such as processor 1307, system memory 1308 (e.g., RAM), static storage device 1309 (e.g., ROM), disk drive 1310 (e.g., magnetic or optical), communication interface 1314 (e.g., modem or Ethernet card), display 1311 (e.g., CRT or LCD), input device 1312 (e.g., keyboard), and cursor control (not shown).

According to one embodiment, computer system 1300 performs specific operations by one or more processor or processor cores 1307 executing one or more sequences of one or more instructions contained in system memory 1308. Such instructions may be read into system memory 1308 from another computer readable/usable storage medium, such as static storage device 1309 or disk drive 1310. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1307, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1307 for execution. Such a medium may take many forms, including but not limited to, non-volatile media and volatile media. Non-volatile media includes, for example, optical or magnetic disks, such as disk drive 1310. Volatile media includes dynamic memory, such as system memory 1308.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1300. According to other embodiments of the invention, two or more computer systems 1300 coupled by communication link 1315 (e.g., LAN, PTSN, or wireless network) may perform the sequence of instructions required to practice the invention in coordination with one another.

Computer system 1300 may transmit and receive messages, data, and instructions, including program, i.e., application code, through communication link 1315 and communication interface 1314. Received program code may be executed by processor 1307 as it is received, and/or stored in disk drive 1310, or other non-volatile storage for later execution. In an embodiment, the computer system 1300 operates in conjunction with a data storage system 1331, e.g., a data storage system 1331 that contains a database 1332 that is readily accessible by the computer system 1300. The computer system 1300 communicates with the data storage system 1331 through a data interface 1333. A data interface 1333, which is coupled to the bus 1306, transmits and receives electrical, electromagnetic or optical signals that include data streams representing various types of signal information, e.g., instructions, messages and data. In embodiments of the invention, the functions of the data interface 1333 may be performed by the communication interface 1314.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for interactively implementing physical electronic designs with track patterns, comprising:
    using a computing system having at least one processor or at least one processor core to perform a process by executing a sequence of instructions stored in memory of the computing system, the process comprising:
    identifying, at a user interface, a component to be physically implemented in a region in an electronic design;
    identifying a number of track patterns for the region; and
    implementing, at one or more track pattern modules and an interactive editing module stored at least partially in memory of and functioning in conjunction with the at least one processor of the computing system, the component at least
    by executing the interactive editing module that displays a graphical emphasis for or on one or more active tracks in a track pattern, which is reduced from the number of track patterns, in the user interface based at least in part on an user interaction, and
    by snapping the component to the one or more active tracks based at least in part on the user interaction while complying with one or more design rules without having to perform design rule checks for the one or more design rules, wherein
    the track pattern in the number of track patterns includes a permitted legal arrangement of a plurality of active tracks that are associated with respective width values with which components implemented along the plurality of active tracks are to comply.

2. The computer implemented method of claim 1, the process further comprising:
    reducing the number of track patterns to a reduced number of track patterns; and
    assigning the reduced number of track patterns to the region for physical implementation of the component in the region.

3. The computer implemented method of claim 2, the process further comprising:
    associating the component with the region by using a linking structure; and
    determining whether the implementation of the component adversely affects assignment of the reduced number of track patterns to the region.

4. The computer implemented method of claim 1, the process further comprising:
    determining whether there is an existing track pattern assigned to the region;
    identifying or determining a constraint for track pattern from the component; and
    determining whether the existing track pattern is to be used for physical implementation of the component in the region based at least in part upon the constraint identified or determined from the component.

5. The computer implemented method of claim 1, the process further comprising:
    determining the reduced number of track patterns based at least in part upon one or more first characteristics of the component or one or more second characteristics of an adjacent layer.

6. The computer implemented method of claim 1, the process further comprising:
    identifying or determining one or more guide layers for physical implementation of the component in the region.

7. The computer implemented method of claim 1, the process further comprising:
    identifying or determining one or more guide points for the component; and
    snapping the one or more guide points to the one or more active tracks to implement the component in the region.

8. The computer implemented method of claim 1, the process further comprising:
    determining whether there is a violation in physical implementation of the component in the region.

9. The computer implemented method of claim 8, the process further comprising:
    identifying context information for the component;
    determining whether the physical implementation causes a change in the context information; and
    determining a fix for the violation based at least in part upon the change in the context information.

10. The computer implemented method of claim 8, the process further comprising:
determining whether using a current layer including the region and an adjacent layer for the physical implementation resolves the violation;
identifying a characteristic of the adjacent layer; and
performing physical implementation of the component by using the current layer and the adjacent layer.

11. The computer implemented method of claim 1, the process further comprising:
associating the component with the region by using a linking structure; and
determining whether the implementation of the component adversely affects assignment of a reduced number of track patterns to the region.

12. The computer implemented method of claim 1, the process further comprising:
dynamically or iteratively adjusting assignment of a reduced set of track patterns to the region based at least in part upon physical implementation of multiple components in the region.

13. The computer implemented method of claim 1, the process further comprising:
ranking or scoring the reduced set of track patterns assigned to the region based at least in part upon the physical implementation of one or more components.

14. The computer implemented method of claim 1, the process further comprising:
dynamically modifying at least one track pattern of the multiple track patterns based in part or in whole upon physical implementation of the component and/or one or more characteristics of the component that is to be physically implemented in the region in the electronic design.

15. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for interactively implementing physical electronic designs with track patterns, the set of acts comprising:
using a computing system having at least one processor or at least one processor core to perform a process by executing a sequence of instructions stored in memory of the computing system, the process comprising:
identifying, at a user interface, a component to be physically implemented in a region in an electronic design;
identifying a number of track patterns for the region; and
implementing, at one or more track pattern modules and an interactive editing module stored at least partially in memory of and functioning in conjunction with the at least one processor of the computing system, the component at least
by executing the interactive editing module that displays a graphical emphasis for or on one or more active tracks in a track pattern, which is reduced from the number of track patterns, in the user interface based at least in part on an user interaction, and
by snapping the component to one or more active tracks based at least in part on the user interaction while complying with one or more design rules without having to perform design rule checks for the one or more design rules, wherein
the track pattern in the number of track patterns includes a permitted legal arrangement of a plurality of active tracks that are associated with respective width values with which components implemented along the plurality of active tracks are to comply.

16. The article of manufacture of claim 15, the set of acts further comprising at least one of:
a first set of acts, comprising:
reducing the number of track patterns to a reduced number of track patterns; and
assigning the reduced number of track patterns to the region for physical implementation of the component in the region;
a second set of acts, comprising:
associating the component with the region by using a linking structure; and
determining whether the implementation of the component adversely affects assignment of the reduced number of track patterns to the region; or
a third set of acts, comprising:
determining whether there is an existing track pattern assigned to the region;
identifying or determining a constraint for track pattern from the component; and
determining whether the existing track pattern is to be used for physical implementation of the component in the region based at least in part upon the constraint identified or determined from the component.

17. The article of manufacture of claim 15, the set of acts further comprising at least one of:
a first set of acts, comprising:
determining the reduced number of track patterns based at least in part upon one or more first characteristics of the component or one or more second characteristics of an adjacent layer;
a second set of acts, comprising:
identifying or determining one or more guide layers for physical implementation of the component in the region;
a third set of acts, comprising:
identifying or determining one or more guide points for the component; and
snapping the one or more guide points to the one or more active tracks to implement the component in the region;
determining whether the existing track pattern is to be used for physical implementation of the component in the region based at least in part upon the constraint identified or determined from the component; or
a fourth set of acts, comprising:
dynamically modifying at least one track pattern of the multiple track patterns based in part or in whole upon physical implementation of the component and/or one or more characteristics of the component that is to be physically implemented in the region in the electronic design.

18. A system for interactively implementing physical electronic designs with track patterns, comprising:
at least one computer processor or processor core of a computing system;
memory storing thereupon a sequence of instructions which, when executed by the at least one computer processor or processor core, causes the at least one processor or processor core at least to:
a user interface configured to identify a component to be physically implemented in a region in an electronic design;
identify a number of track patterns for the region; and
one or more track pattern modules and an interactive editing module stored at least partially in memory of and functioning in conjunction with the at least one processor of the computing system and configured to implement the component at least
- by executing the interactive editing module that displays a graphical emphasis for or on one or more active tracks in a track pattern, which is reduced from the number of track patterns, in the user interface based at least in part on an user interaction, and
- by snapping the component to one or more active tracks based at least in part on the user interaction while complying with one or more design rules without having to perform design rule checks for the one or more design rules, wherein
- the track pattern in the number of track patterns includes a permitted legal arrangement of a plurality of active tracks that are associated with respective width values with which components implemented along the plurality of active tracks are to comply.

19. The system of claim 18, wherein the at least one computer processor or processor core is further to:
- execute one or more subsets of instructions of the sequence of instruction stored in the memory, wherein the one or more subsets of instructions include at least one of:
- a first subset of instructions of the sequence of instructions, when executed by the at least one computer processor or processor core, causes the at least one computer processor or processor core to reduce the number of track patterns to a reduced number of track patterns and to assign the reduced number of track patterns to the region for physical implementation of the component in the region;
- a second subset of instructions of the sequence of instructions, when executed by the at least one computer processor or processor core, causes the at least one computer processor or processor core to associate the component with the region by using a linking structure and to determine whether the implementation of the component adversely affects assignment of the reduced number of track patterns to the region;
- a third subset of instructions of the sequence of instructions, when executed by the at least one computer processor or processor core, causes the at least one computer processor or processor core to determine whether there is an existing track pattern assigned to the region, to identify or determine a constraint for track pattern from the component, and to determine whether the existing track pattern is to be used for physical implementation of the component in the region based at least in part upon the constraint identified or determined from the component.

20. The system of claim 18, wherein the at least one computer processor or processor core is further to:
- execute one or more subsets of instructions of the sequence of instruction stored in the memory, wherein the one or more subsets of instructions include at least one of:
- a first subset of instructions of the sequence of instructions, when executed by the at least one computer processor or processor core, causes the at least one computer processor or processor core to identify or determine one or more guide layers for physical implementation of the component in the region;
- a second subset of instructions of the sequence of instructions, when executed by the at least one computer processor or processor core, causes the at least one computer processor or processor core to identify or determine one or more guide points for the component and to snap the one or more guide points to the one or more active tracks to implement the component in the region;
- a third subset of instructions of the sequence of instructions, when executed by the at least one computer processor or processor core, causes the at least one computer processor or processor core to determine whether there is a violation in physical implementation of the component in the region;
- a fourth subset of instructions of the sequence of instructions, when executed by the at least one computer processor or processor core, causes the at least one computer processor or processor core to identify context information for the component, to determine whether the physical implementation causes a change in the context information, and to determine a fix for the violation based at least in part upon the change in the context information; or
- a fifth subset of instructions of the sequence of instructions, when executed by the at least one computer processor or processor core, causes the at least one computer processor or processor core to dynamically modify at least one track pattern of the multiple track patterns based in part or in whole upon physical implementation of the component and/or one or more characteristics of the component that is to be physically implemented in the region in the electronic design.

* * * * *